(12) United States Patent
Jun et al.

(10) Patent No.: US 9,813,074 B2
(45) Date of Patent: *Nov. 7, 2017

(54) CALIBRATION OF INTERPOLATING STRING DIGITAL-TO-ANALOG CONVERTERS

(71) Applicant: TEXAS INSTRUMENTS INCORPORATED, Dallas, TX (US)

(72) Inventors: Zhang Jun, Shanghai (CN); Xuan Wang, Goleta, CA (US); Dongyu Ou, Shanghai (CN); Elliott Zhang, Shanghai (CN); Echo Cao, Shanghai (CN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/470,274

(22) Filed: Mar. 27, 2017

(65) Prior Publication Data

US 2017/0201265 A1 Jul. 13, 2017

Related U.S. Application Data

(63) Continuation of application No. 15/152,384, filed on May 11, 2016, now Pat. No. 9,621,177, which is a (Continued)

(51) Int. Cl.
*H03M 1/10* (2006.01)
*H03M 1/66* (2006.01)
(Continued)

(52) U.S. Cl.
CPC ........... *H03M 1/1033* (2013.01); *H03M 1/66* (2013.01); *H03M 1/00* (2013.01); *H03M 1/12* (2013.01); *H03M 1/747* (2013.01)

(58) Field of Classification Search
CPC ........... H03M 1/12; H03M 1/00; H03M 1/747
(Continued)

(56) References Cited

U.S. PATENT DOCUMENTS 6,246,351 B1 6/2001 Yilmaz
6,707,404 B1 3/2004 Yilmaz
(Continued)

*Primary Examiner* — Joseph Lauture
(74) *Attorney, Agent, or Firm* — John R. Pessetto; Charles A. Brill; Frank D. Cimino

(57) ABSTRACT

Methods, apparatus and articles of manufacture (e.g., physical storage media) to calibrate interpolating string digital-to-analog converters are disclosed. Example methods disclosed herein to calibrate a digital-to-analog converter (DAC) include determining a first calibration codeword based on a first nonlinearity error value measured at an output of the DAC when a most-significant-bit (MSB) portion of an input codeword is applied to an input of the DAC. Such disclosed example methods also include determining a second calibration codeword based on a second measured nonlinearity error value measured at the output of the DAC when a least-significant-bit (LSB) portion of the input codeword is applied to the input of the DAC. Such disclosed example methods further include combining the first calibration codeword and the second calibration codeword to determine a third calibration codeword to be accessed by the DAC to calibrate the output of the DAC when the input codeword is applied to the DAC.

2 Claims, 8 Drawing Sheets

Related U.S. Application Data continuation of application No. PCT/CN2015/096626, filed on Dec. 8, 2015.

(51) Int. Cl.
  *H03M 1/12* (2006.01)
  *H03M 1/74* (2006.01)
  *H03M 1/00* (2006.01)

(58) Field of Classification Search
  USPC .......................... 341/120, 118, 119, 144, 145
  See application file for complete search history.

(56) References Cited

U.S. PATENT DOCUMENTS

| | | |
|---|---|---|
| 7,352,306 B2 | 4/2008 | Xu |
| 9,621,177 B1 * | 4/2017 | Jun .................... H03M 1/1033 |
| 2011/0109487 A1 | 5/2011 | Agi |

\* cited by examiner

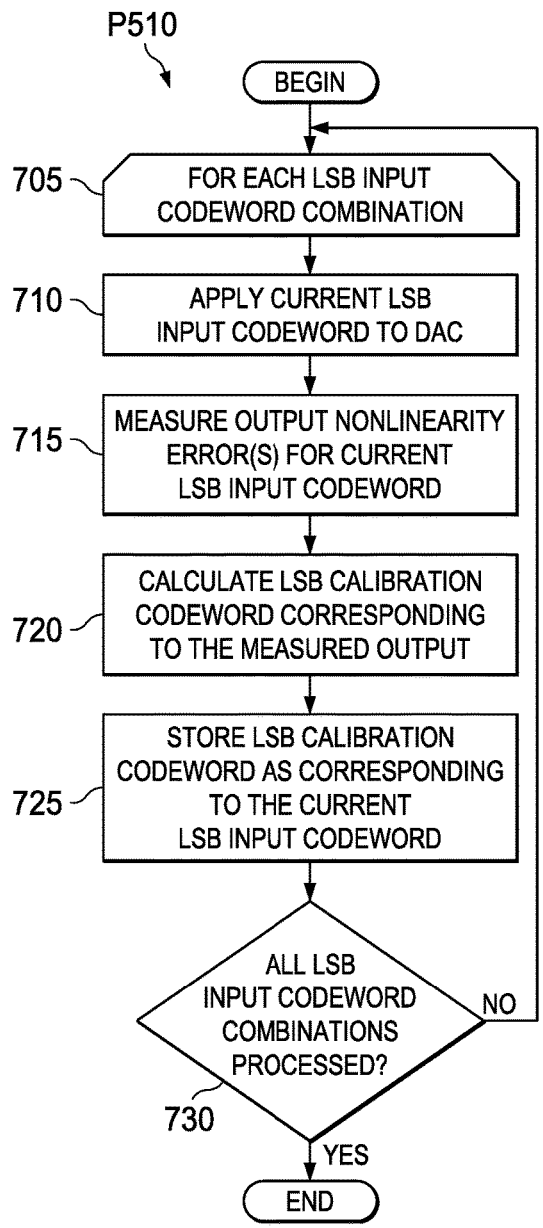
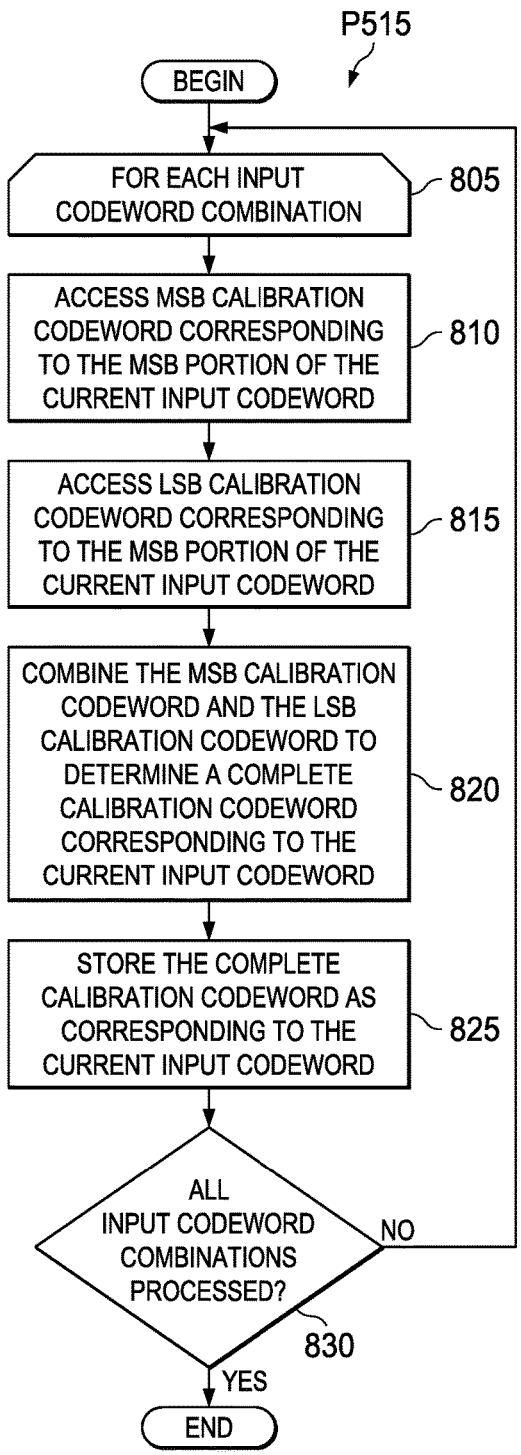
FIG. 7
FIG. 8

CALIBRATION OF INTERPOLATING STRING DIGITAL-TO-ANALOG CONVERTERS

RELATED APPLICATION(S)

This application is a continuation of U.S. patent application Ser. No. 15/152,384 filed May 11, 2016 which is a continuation of co-pending International Application No. PCT/CN2015/096626, with an international filing date of Dec. 8, 2015, which designated the United States and is hereby fully incorporated herein by reference for all purposes.

FIELD OF THE DISCLOSURE

This disclosure relates generally to digital-to-analog converters and, more particularly, to calibration of interpolating string digital-to-analog converters.

BACKGROUND

Digital-to-analog converters convert a digital input codeword to an output analog signal, such as an output analog voltage or an output analog current. Interpolating string digital-to-analog converters include a coarse string digital-to-analog converter (DAC) circuit to generate high and low analog signals defining a coarse analog signal range based on a most-significant-bit (MSB) portion of the digital input codeword. Interpolating string DACs further include an interpolator circuit to interpolate, based on a least-significant-bit (LSB) portion of the digital input codeword, an analog signal having a value between the high and low analog signals defining the coarse analog signal range. This interpolated analog signal forms the overall analog signal to be output by the interpolating string DAC in response to the digital input codeword being applied to the input of the DAC.

The output analog signals generated by DACs, including interpolating string DACs, may exhibit nonlinearity errors, such as integral nonlinearity errors, differential nonlinearity errors, etc. To compensate for such errors, some DACs, including some interpolating string DACs, include a calibration DAC circuit to adjust the analog signal output by main DAC circuit. In general, the calibration DAC circuit is able to generate respective calibration signals for different digital input codewords, with the respective calibration signals being tailored to compensate for the particular nonlinearity errors exhibited by the respective analog signals generated by the main DAC circuit for the different digital input codewords. A calibration procedure is used to determine the respective calibration signals to be generated by the calibration DAC circuit for the different possible digital input codewords.

SUMMARY

Example methods, apparatus and articles of manufacture (e.g., physical storage media) disclosed herein relate generally to calibration of digital-to-analog converters and, more particularly, to calibration of interpolating string digital-to-analog converters. Example methods disclosed herein to calibrate a DAC include determining a first calibration codeword based on a first nonlinearity error value measured at an output of the DAC when an MSB portion of an input codeword is applied to an input of the DAC. Example methods disclosed herein also include determining a second calibration codeword based on a second measured nonlinearity error value measured at the output of the DAC when an LSB portion of the input codeword is applied to the input of the DAC. Example methods disclosed herein further include combining the first calibration codeword and the second calibration codeword to determine a third calibration codeword to be accessed by the DAC to calibrate the output of the DAC when the input codeword is applied to the DAC.

In some such disclosed examples, the DAC is an interpolating string DAC including a main coarse string DAC circuit and a main interpolator circuit. In some such disclosed examples, the MSB portion of the input codeword corresponds to a number of bits of resolution of the main coarse string DAC circuit, and the LSB portion of the input codeword corresponds to a number of bits of resolution of the main interpolator circuit.

In some such disclosed examples, the DAC further includes a calibration coarse string DAC circuit and a calibration interpolator circuit. Some such disclosed example methods further include storing the third calibration codeword in a codeword storage of the interpolating string DAC. In some such disclosed examples, the interpolating string DAC is to retrieve and apply the third calibration codeword to the calibration coarse string DAC circuit and the calibration interpolator circuit of the interpolating string DAC to calibrate the output of the interpolating string DAC when the input codeword is applied to the interpolating string DAC.

In some such disclosed example methods, determining the first calibration codeword includes multiplying the first nonlinearity error value by a ratio of a full range of the calibration interpolator circuit divided by a calibration step size of the calibration interpolator circuit to determine an intermediate value. In some such disclosed example methods, determining the first calibration codeword also includes setting the first calibration codeword to be a next lowest integer less than or equal to the intermediate value.

Additionally or alternatively, in some such disclosed example methods, determining the second calibration codeword includes dividing the second nonlinearity error value by a calibration step size of the calibration interpolator circuit to determine an intermediate value. In some such disclosed example methods, determining the first calibration codeword also includes setting the second calibration codeword to be a next lowest integer less than or equal to the intermediate value.

Additionally or alternatively, in some disclosed example methods, combining the first calibration codeword and the second calibration codeword to determine the third calibration codeword includes adding the first calibration codeword and the second calibration codeword to determine the third calibration codeword.

Additionally or alternatively, some disclosed example methods further include calculating a third nonlinearity error value based on the first nonlinearity error value and the second nonlinearity error value. For example, the third nonlinearity error value may correspond to an uncalibrated output value that would be output from the DAC if the input codeword is applied to the input of the DAC without calibration being performed. Additionally or alternatively, some disclosed example methods also include calculating a fourth nonlinearity error value based on the first nonlinearity error value, the first calibration codeword, the second nonlinearity error value and the second calibration codeword. For example, the fourth nonlinearity error value may correspond to a calibrated output value that would be output from the DAC if the input codeword is applied to the input of the DAC with calibration being performed.

Example DAC calibrators disclosed herein include a first codeword calibrator to determine a first calibration codeword based on a first nonlinearity error value measured at an output of a DAC when an MSB portion of an input codeword is applied to an input of the DAC. Example DAC calibrators disclosed herein also include a second codeword calibrator to determine a second calibration codeword based on a second measured nonlinearity error value measured at the output of the DAC when an LSB portion of the input codeword is applied to the input of the DAC. Example DAC calibrators disclosed herein further include a calibration codeword combiner to combine the first calibration codeword and the second calibration codeword to determine a third calibration codeword to be accessed by the DAC to calibrate the output of the DAC when the input codeword is applied to the DAC.

In some such disclosed examples, the DAC is an interpolating string DAC including a main coarse string DAC circuit and a main interpolator circuit. In some such disclosed examples, the MSB portion of the input codeword corresponds to a number of bits of resolution of the main coarse string DAC circuit, and the LSB portion of the input codeword corresponds to a number of bits of resolution of the main interpolator circuit.

In some such disclosed examples, the DAC further includes a calibration coarse string DAC circuit and a calibration interpolator circuit. In some such disclosed example DAC calibrators, the calibration codeword combiner is further to store the third calibration codeword in a codeword storage of the interpolating string DAC. In some such disclosed examples, the interpolating string DAC is to retrieve and apply the third calibration codeword to the calibration coarse string DAC circuit and the calibration interpolator circuit of the interpolating string DAC to calibrate the output of the interpolating string DAC when the input codeword is applied to the interpolating string DAC.

In some such disclosed example DAC calibrators, the first codeword calibrator is to determine the first calibration codeword by multiplying the first nonlinearity error value by a ratio of a full range of the calibration interpolator circuit divided by a calibration step size of the calibration interpolator circuit to determine an intermediate value. In some such disclosed examples, the first codeword calibrator is to determine the first calibration codeword by also setting the first calibration codeword to be a next lowest integer less than or equal to the intermediate value.

Additionally or alternatively, in some such disclosed example DAC calibrators, the second codeword calibrator is to determine the second calibration codeword by dividing the second nonlinearity error value by a calibration step size of the calibration interpolator circuit to determine an intermediate value. In some such disclosed examples, the second codeword calibrator is to determine the second calibration codeword by also setting the second calibration codeword to be a next lowest integer less than or equal to the intermediate value.

Additionally or alternatively, in some such disclosed example DAC calibrators, the calibration codeword combiner is to determine the third calibration codeword by adding the first calibration codeword and the second calibration codeword to determine the third calibration codeword.

Additionally or alternatively, some such disclosed example DAC calibrators further include a nonlinearity measurer to measure the first nonlinearity error value and the second nonlinearity error value. In some disclosed examples, the nonlinearity measurer is also to calculate a third nonlinearity error value based on the first nonlinearity error value and the second nonlinearity error value. For example, the third nonlinearity error value may correspond to an uncalibrated output value that would be output from the DAC if the input codeword is applied to the input of the DAC without calibration being performed. Additionally or alternatively, in some disclosed examples, the nonlinearity measurer is further to calculate a fourth nonlinearity error value based on the first nonlinearity error value, the first calibration codeword, the second nonlinearity error value and the second calibration codeword. For example, the fourth nonlinearity error value may correspond to a calibrated output value that would be output from the DAC if the input codeword is applied to the input of the DAC with calibration being performed.

Example tangible machine readable storage media disclosed herein include disclosed example machine readable instructions which, when executed, cause a processor to at least determine a first calibration codeword based on a first nonlinearity error value measured at an output of the DAC when an MSB portion of an input codeword is applied to an input of the DAC. Some such disclosed example instructions, when executed, also cause the processor to determining a second calibration codeword based on a second measured nonlinearity error value measured at the output of the DAC when an LSB portion of the input codeword is applied to the input of the DAC. Some such disclosed example instructions, when executed, further cause the processor to combine the first calibration codeword and the second calibration codeword to determine a third calibration codeword to be accessed by the DAC to calibrate the output of the DAC when the input codeword is applied to the DAC.

In some disclosed examples, the DAC is an interpolating string DAC including a main coarse string DAC circuit and a main interpolator circuit. In some disclosed examples, the MSB portion of the input codeword corresponds to a number of bits of resolution of the main coarse string DAC circuit, and the LSB portion of the input codeword corresponds to a number of bits of resolution of the main interpolator circuit.

In some such disclosed examples, the DAC further includes a calibration coarse string DAC circuit and a calibration interpolator circuit. Some disclosed example instructions, when executed, further cause the processor to store the third calibration codeword in a codeword storage of the interpolating string DAC. In some such disclosed examples, the interpolating string DAC is to retrieve and apply the third calibration codeword to the calibration coarse string DAC circuit and the calibration interpolator circuit of the interpolating string DAC to calibrate the output of the interpolating string DAC when the input codeword is applied to the interpolating string DAC.

Some disclosed example instructions, when executed, cause the processor to determine the first calibration codeword by multiplying the first nonlinearity error value by a ratio of a full range of the calibration interpolator circuit divided by a calibration step size of the calibration interpolator circuit to determine an intermediate value. Some disclosed example instructions, when executed, cause the processor to determine the first calibration codeword by also setting the first calibration codeword to be a next lowest integer less than or equal to the intermediate value.

Additionally or alternatively, some disclosed example instructions, when executed, cause the processor to determine the second calibration codeword by dividing the second nonlinearity error value by a calibration step size of the calibration interpolator circuit to determine an intermediate value. Some disclosed example instructions, when executed, cause the processor to determine the second calibration codeword by also setting the second calibration codeword to be a next lowest integer less than or equal to the intermediate value.

Additionally or alternatively, some disclosed example instructions, when executed, cause the processor to determine the third calibration codeword by adding the first calibration codeword and the second calibration codeword to determine the third calibration codeword.

Additionally or alternatively, some disclosed example instructions, when executed, further cause the processor to calculate a third nonlinearity error value based on the first nonlinearity error value and the second nonlinearity error value. For example, the third nonlinearity error value may correspond to an uncalibrated output value that would be output from the DAC if the input codeword is applied to the input of the DAC without calibration being performed. Additionally or alternatively, some disclosed example instructions, when executed, also cause the processor to calculate a fourth nonlinearity error value based on the first nonlinearity error value, the first calibration codeword, the second nonlinearity error value and the second calibration codeword. For example, the fourth nonlinearity error value may correspond to a calibrated output value that would be output from the DAC if the input codeword is applied to the input of the DAC with calibration being performed.

Example calibration resistor circuits disclosed herein for an interpolating string DAC include a second string of resistors electrically coupled in a series arrangement, with the second string of resistors to be electrically coupled in parallel to a unit resistor of a first string of resistors included in a main coarse string DAC circuit of the interpolating string DAC, and with respective ones of the resistors in the second string of resistors to be electrically coupled to respective inputs of a level detector included in a calibration coarse string DAC circuit of the interpolating string DAC. Disclosed example calibration resistor circuits also include a grouping of resistors electrically coupled in a parallel arrangement, with a first circuit node of the grouping of resistors electrically coupled to the second string of resistors and to be electrically coupled to the unit resistor of the first string of resistors.

In some disclosed example calibration resistor circuits, a second circuit node of the grouping of resistors is electrically coupled to ground.

Additionally or alternatively, in some disclosed example calibration resistor circuits, the first circuit node of the grouping of resistors is further to be electrically coupled to a first input of the level detector. In some such disclosed example calibration resistor circuits, the respective ones of the resistors in the second string of resistors are to be electrically coupled to the respective inputs of the level detector that correspond to higher voltages than the first input of the level detector.

Additionally or alternatively, in some disclosed example calibration resistor circuits, a number of resistors included in the grouping of resistors is one more than a number of resistors included in the second string of resistors, and the resistors included in the grouping of resistors, the resistors included in the second string of resistors and the resistors included in the first string of resistors have substantially the same resistance values.

Additionally or alternatively, in some disclosed example calibration resistor circuits, the grouping of resistors has an equivalent resistance substantially equal to a resistance of one of the resistors included in the second string of resistors divided by one more than a number of resistors included in the second string of resistors.

BRIEF DESCRIPTION OF THE DRAWINGS

FIGS. 5-9 are flowcharts representative of example machine readable instructions that may be executed to implement the example DAC calibrator of FIG. 4.

The figures are not to scale. Wherever possible, the same reference numbers will be used throughout the drawing(s) and accompanying written description to refer to the same or like parts, elements, etc.

DETAILED DESCRIPTION

Figure 1:
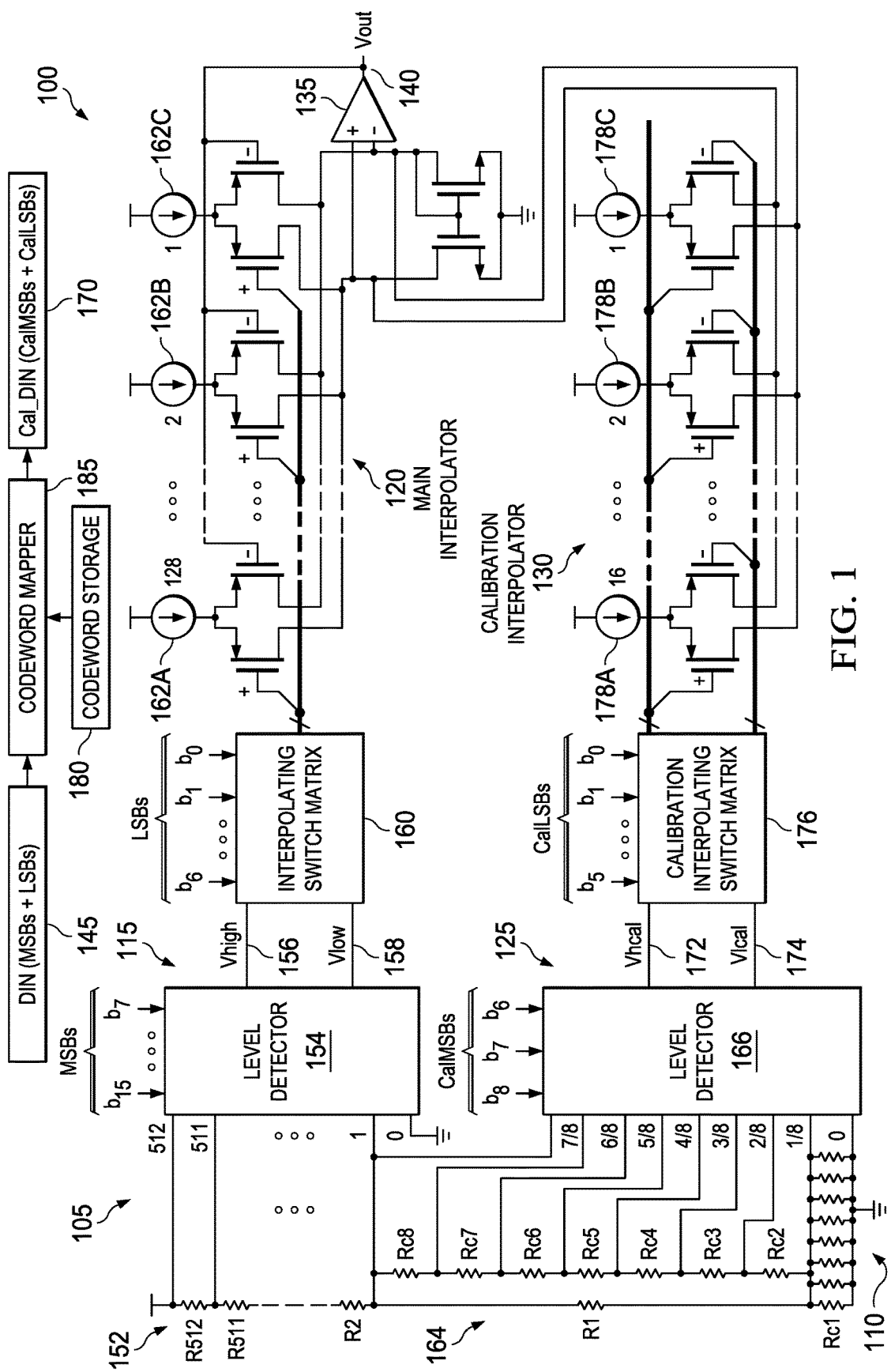
FIG. 1 is a block diagram of a first example interpolating string DAC capable of being calibrated in accordance with the teachings of this disclosure.

Methods, apparatus and articles of manufacture (e.g., physical storage media) to implement calibration of interpolating string DACs are disclosed herein. As mentioned above, modern DACs, including interpolating string DACs, include a calibration DAC circuit to compensate for nonlinearity errors exhibited by the analog signal generated by a main DAC circuit of the DAC in response to a particular digital input codeword. Furthermore, the different respective analog signals generated by the main DAC circuit in response to different digital input codewords may exhibit different nonlinearity errors. Accordingly, the calibration DAC circuit is typically structured to be able to generate respective calibration signals corresponding to the different possible digital input codewords. The calibration DAC circuit generates these respective calibration signals in response to respective calibration codewords applied to the calibration DAC circuit. A codeword memory or other codeword storage mechanism is used to store the respective calibration codeword to be applied to the calibration DAC circuit for each possible digital input codeword.

The respective calibration codewords to be associated with the different possible digital input codewords are determined using a calibration procedure. Prior calibration procedures typically involve cycling through each possible digital input codeword to measure the respective nonlinearity error(s) exhibited by the analog signal generated for the possible digital input codeword, and to determine the respective calibration codeword to generate a corresponding calibration signal to compensate for the errors. Thus, for an N-bit DAC, which accepts digital input codewords having N bits, such prior calibration procedures involve cycling through each of the $2^N$ possible digital input codeword to determine the $2^N$ respective calibration codewords corresponding to these digital input codewords, which can take a substantial amount of time, processing resources, etc.

Unlike such prior calibration procedures, disclosed example methods, apparatus and articles of manufacture (e.g., physical storage media) implement disclosed example DAC calibration processes that do not involve cycling through each of the $2^N$ possible digital input codeword to determine $2^N$ respective calibration codewords corresponding to these digital input codewords. Instead, disclosed example DAC calibration processes divide the digital input codewords into MSB portions and LSB portions, and perform respective calibration processes to determine MSB calibration codewords and LSB calibration codewords corresponding, respectively, to the different possible MSB portions of the digital input codewords and the different possible LSB portions of the digital input codewords. The disclosed example DAC calibration processes then combine the MSB calibration codewords and the LSB calibration codewords to form the $2^N$ respective calibration codewords corresponding to the $2^N$ possible digital input codewords.

For example, for digital input codewords having N bits, assume that the MSB portions of the digital input codewords include the M most significant bits, and the LSB portions of the digital input codewords include the L least significant bits, such that M+L=N. Some disclosed example calibration processes perform a first calibration process (e.g., an MSB calibration process) that involves cycling through each of the $2^M$ possible combinations of the MSB portions of the digital input codewords to determine $2^M$ respective MSB calibration codewords. Some disclosed example calibration processes also perform a second calibration process (e.g., an LSB calibration process) that involves cycling through each of the $2^L$ possible combinations of the LSB portions of the digital input codewords to determine $2^L$ respective LSB calibration codewords. Some disclosed example calibration processes further combine the determined MSB calibration codewords and LSB calibration codewords for different possible combinations of the MSB portions and LSB portions of the digital input codewords to determine the $2^N$ respective calibration codewords corresponding to the $2^N$ possible digital input codewords.

Thus, the example DAC calibration processes disclosed herein can determine the $2^N$ respective calibration codewords corresponding to the $2^N$ possible digital input codewords with just $2^M+2^L$ calibration iterations, which may be much less than the $2^N$ calibration iterations required by the prior DAC calibration procedures. For example, for a 16-bit DAC, which processes digital input codewords of N=16 bits, a prior DAC calibration procedure may require $2^{16}$=65,536 calibration iterations to determine the 65,536 respective calibration codewords corresponding to the 65,536 possible digital input codewords. However, a disclosed example DAC calibration process in which the digital input codewords are divided into MSB portions having M=9 bits and LSB portions having L=7 bits involves just $2^9+2^7$=640 calibration iterations to determine the 65,536 respective calibration codewords corresponding to the 65,536 possible digital input codewords, which is over two (2) orders of magnitude less than the number of calibration iterations required by the prior procedures. As such, substantial savings in processor resources, computational time, etc., can be achieved with the example DAC calibration processes disclosed herein.

As disclosed in further detail below, when calibrating interpolating string DACs, the size of the MSB portion (M) of the digital input codewords can be selected to coincide with a number of bits of resolution of the main coarse string DAC circuit of the interpolating string DAC, whereas the size of the LSB portion (L) of the digital input codewords can be selected to coincide with a number of bits of resolution of the main interpolator circuit of the interpolating string DAC. Further details concerning example methods, apparatus, systems and articles of manufacture (e.g., physical storage media) to implement DAC calibration in accordance with the teachings of this disclosure are provided below.

As also mentioned above, DACs supporting calibration may include a main DAC circuit to generate an analog signal in response to the digital input codeword, and a calibration DAC circuit to generate a calibration signal in response to a calibration codeword corresponding to the digital input codeword. In the case of interpolating string DACs, the main DAC circuit includes a main coarse string DAC circuit to generate high and low analog signals defining a coarse analog signal range based on the MSB portion of the digital input codeword, and a main interpolator circuit to interpolate between this coarse analog signal range based on the LSB portion of the digital input codeword to generate a main analog signal in response to the digital input codeword. In disclosed example interpolating string DACs which support calibration, the calibration circuit includes a calibration coarse string DAC circuit to generate high and low analog signals defining a coarse analog signal range based on an MSB portion of a calibration codeword, and a calibration interpolator circuit to interpolate between this coarse analog signal range based on an LSB portion of the calibration codeword to generate a calibration analog signal in response to the calibration codeword. Furthermore, in example interpolating string DACs disclosed herein, the calibration coarse string DAC circuit includes a calibration resistor circuit that is used to replace a unit resistor of the main coarse string DAC circuit. As disclosed in further detail below, such a resistor circuit allows the main coarse string DAC circuit and the calibration coarse string DAC circuit to be implemented with resistors having substantially the same values (e.g., within an error tolerance), thereby simplifying overall circuit complexity, reducing cost, etc.

Turning to the figures, a block diagram of an example interpolating string DAC 100 capable of being calibrated in accordance with the teachings of this disclosure is illustrated in FIG. 1. The example interpolating string DAC 100 of FIG. 1 includes an example main DAC circuit 105 and an example calibration DAC circuit 110. The main DAC circuit 105 of the illustrated example includes an example main coarse string DAC circuit 115 that drives an example main interpolator circuit 120. The calibration DAC circuit 110 of the illustrated example includes an example calibration coarse string DAC circuit 125 that drives an example calibration interpolator circuit 130. In the illustrated example of FIG. 1, the main DAC circuit 105 generates a main analog signal and the calibration DAC circuit 110 generates a calibration analog signal. The main analog signal generated by the main DAC circuit 105 and the calibration analog signal generated by the calibration DAC circuit 110 are combined in an example output stage 135 to generate an overall analog signal output 140 in response to an example digital input codeword 145.

The example main coarse string DAC circuit 115 includes an example main resistor string 152 and an example level detector 154 to generate, based on an MSB portion of the digital input codeword 145, an example high analog signal 156 and an example low analog signal 158 defining a coarse analog signal range corresponding to the MSB portion of the digital input codeword 145. In the illustrated example of FIG. 1, the main resistor string 152 includes a number of resistors electrically coupled in series, with the number of resistors corresponding to the range of an MSB portion of the digital input codeword 145 to be applied to the main DAC circuit 105. For example, if the size of the MSB portion of the digital input codeword 145 is M bits, then the number of resistors included in the example main resistor string 152 is $2^M$, which corresponds to the full range of the MSB portion of the digital input codeword 145. In the illustrated example of FIG. 1, M=9 and, as such, the number of resistors included in the example main resistor string 152 is $2^9$=512 (labeled R1 through R512 in FIG. 1). In the illustrated example of FIG. 1, the resistance values of the resistors included in the main resistor string 152 are substantially equal (e.g., are equal within an error tolerance), and have any appropriate value.

In the example main coarse string DAC circuit 115 of FIG. 1, each resistor of the main resistor string 152 (except the unit resistor, R1) is electrically coupled to a respective pair of inputs of the example level detector 154 to define a respective coarse analog signal range (e.g., voltage range) corresponding to the respective high and low voltages across the resistor. In the case of the unit resistor R1, the high voltage end of the unit resistor is electrically coupled to the unit input of the level detector 154, whereas the zero input of the level detector 154 is electrically coupled to ground. The example level detector 154 implements a switch arrangement to select, based on the MSB portion of the digital input codeword 145, the voltages applied to one of the pairs of inputs to be electrically coupled to the example high analog signal 156 and the example low analog signal 158, which thereby defines the coarse analog signal range corresponding to the MSB portion of the digital input codeword 145. Example implementations of the main resistor string 152 and the example level detector 154 are further described in, for example, U.S. Pat. No. 6,246,351 to Yilmaz, which is entitled "LSB INTERPOLATION CIRCUIT AND METHOD FOR SEGMENTED DIGITAL-TO-ANALOG CONVERTER" and issued on Jun. 12, 2001, and U.S. Pat. No. 6,707,404 to Yilmaz, which is entitled "INTEGRAL NONLINEARITY ERROR CORRECTION CIRCUITRY AND METHOD FOR DAC" and issued on Mar. 16, 2004.

The example main interpolator circuit 120 of FIG. 1 includes an example interpolating switch matrix 160 and a bank of example transistor stages 162A-C to interpolate, based on the LSB portion of the digital input codeword 145, an analog signal (e.g., a voltage level) between the respective values of the high analog signal 156 and the low analog signal 158 output by the main coarse string DAC circuit 115 based on the MSB portion of the digital input codeword 145. In the illustrated example of FIG. 1, the bank of example transistor stages 162A-C includes a number of stages corresponding to the range of the LSB portion of the digital input codeword 145 to be applied to the main DAC circuit 105. For example, if the size of the LSB portion of the digital input codeword 145 is L, then the number of stages included in the example bank of example transistor stages 162A-C is $2^L$, which corresponds to the full range of the LSB portion of the digital input codeword 145. In the illustrated example of FIG. 1, L=7 and, as such, the number of stages included in the example bank of example transistor stages 162A-C is $2^7$=128.

The example interpolating switch matrix 160 includes a switch arrangement to selectively activate one or more of the example transistor stages 162A-C based on the LSB portion of the digital input codeword 145. In the illustrated example of FIG. 1, the interpolating switch matrix 160 selectively activates a number of the example transistor stages 162A-C that is proportional to the numerical value of the LSB portion of the digital input codeword 145, which results in a correspondingly proportional interpolation between the respective values of the high analog signal 156 and the low analog signal 158. For example, if the LSB portion of the digital input codeword 145 is all zeros (e.g., 0000000 in the illustrated example), then the interpolating switch matrix 160 may activate none of the transistor stages 162A-C, which causes the main interpolator circuit 120 to output a resulting analog signal that corresponds to the low analog signal 158. However, if the LSB portion of the digital input codeword 145 is all ones (e.g., 1111111 in the illustrated example), then the interpolating switch matrix 160 may activate all of the transistor stages 162A-C, which causes the main interpolator circuit 120 to output a resulting analog signal that corresponds to the high analog signal 156. However, if the LSB portion of the digital input codeword 145 has a value of k, where $0 \leq k \leq 2^{L-1}$, then the interpolating switch matrix 160 may activate k of the transistor stages 162A-C to yield a resulting analog signal having a value of $V_{output}=V_{low}+(k/2^L)(V_{high}-V_{low})$, where $V_{high}$ is the value of the high analog signal 156, and the $V_{low}$ is the value of the low analog signal 158. The resulting analog signal output from the main interpolator circuit 120 corresponds to the main analog signal generated by the main DAC circuit 105, which is applied to the output stage 135. Example implementations of the interpolating switch matrix 160, the bank of example transistor stages 162A-C and the output stage 135 are further described in, for example, U.S. Pat. No. 6,246,351 and U.S. Pat. No. 6,707,404 mentioned above.

The example calibration coarse string DAC circuit 125 includes an example calibration resistor circuit 164 and an example level detector 166 to generate, based on an MSB portion of an example calibration codeword 170, an example high analog signal 172 and an example low analog signal 174 defining a coarse analog signal range corresponding to the MSB portion of the calibration codeword 170. In the illustrated example of FIG. 1, the calibration resistor circuit 164 includes a string of resistors electrically coupled in series, with the number of resistors in the string corresponding to the range of the MSB portion of the calibration codeword 170. For example, if the size of the MSB portion of the calibration codeword 170 is Mc bits, then the number of resistors included in the example resistor string of the calibration resistor circuit 164 is less than or equal to $2^{Mc}$, which corresponds to the full range of the MSB portion of the calibration codeword 170. In the illustrated example of FIG. 1, Mc=3 and, because the calibration coarse string DAC circuit 125 supports the full range of the MSB portion of the calibration codeword 170, the number of resistors included in the example resistor string of the calibration resistor circuit 164 is $2^3$=8 (labeled Rc1 through Rc512 in FIG. 1).

Furthermore, in the illustrated example of FIG. 1, the unit resistor (RC1) in the example resistor string of the calibration resistor circuit 164 is implemented by an example grouping of resistors electrically coupled in parallel, with the number of resistors in the grouping corresponding to the number of resistors (e.g., less than or equal to $2^{Mc}$) included in the example resistor string of the calibration resistor circuit 164. Additionally, the unit resistor (R1) of the main resistor string 152 of the example main coarse string DAC circuit 115 is electrically coupled in parallel with the resistors (Rc2 through Rc8) included in the resistor string of the calibration resistor circuit 164, except for the unit resistor (Rc1) of the calibration resistor circuit 164, and is electrically coupled in series with the unit resistor (Rc1) of the calibration resistor circuit 164, as shown. Such an arrangements allows the example calibration resistor circuit 164 to be implemented with resistors having resistance values that are substantially equal (e.g., are equal within an error tolerance), and that are substantially equal to the resistance values of the resistors used to implement the main resistor string 152 of the example main coarse string DAC circuit 115.

In the example calibration coarse string DAC circuit 125 of FIG. 1, each resistor of the example resistor string of the calibration resistor circuit 164 (except the unit resistor, Rc1) is electrically coupled to a respective pair of inputs of the example level detector 166 to define a respective coarse analog signal range (e.g., voltage range) corresponding to the respective high and low voltages across the resistor. In the case of the unit resistor Rc1, the high voltage end of the unit resistor is electrically coupled to the unit input of the level detector 166, whereas the zero input of the level detector 166 is electrically coupled to ground. The example level detector 166 implements a switch arrangement to select, based on the MSB portion of the calibration codeword 170, the voltages applied to one of the pairs of inputs to be electrically coupled to the example high analog signal 172 and the example low analog signal 174, which thereby defines the coarse analog signal range corresponding to the MSB portion of the calibration codeword 170. Example implementations of the example level detector 166 are further described in, for example, U.S. Pat. No. 6,707,404 mentioned above.

The example calibration interpolator circuit 130 of FIG. 1 includes an example interpolating switch matrix 176 and a bank of example transistor stages 178A-C to interpolate, based on the LSB portion of the calibration codeword 170, an analog signal (e.g., a voltage level) between the respective values of the high analog signal 172 and the low analog signal 174 output by the calibration coarse string DAC circuit 125 based on the MSB portion of the calibration codeword 170. In the illustrated example of FIG. 1, the bank of example transistor stages 178A-C includes a number of stages corresponding to the range of the LSB portion of the calibration codeword 170 to be applied to the calibration DAC circuit 110. For example, if the size of the LSB portion of the calibration codeword 170 is Lc, then the number of stages included in the example bank of example transistor stages 178A-C is $2^{Lc}$, which corresponds to the full range of the LSB portion of the calibration codeword 170. In the illustrated example of FIG. 1, Lc=6 and, as such, the number of stages included in the example bank of example transistor stages 178A-C is $2^6$=64.

The example interpolating switch matrix 176 includes a switch arrangement to selectively activate one or more of the example transistor stages 178A-C based on the LSB portion of the calibration codeword 170. In the illustrated example of FIG. 1, the interpolating switch matrix 176 selectively activates a number of the example transistor stages 178A-C that is proportional to the numerical value of the LSB portion of the calibration codeword 170, which results in a correspondingly proportional interpolation between the respective values of the high analog signal 172 and the low analog signal 174. For example, if the LSB portion of the calibration codeword 170 is all zeros (e.g., 000000 in the illustrated example), then the interpolating switch matrix 176 may activate none of the transistor stages 178A-C, which causes the calibration interpolator circuit 130 to output a resulting analog signal that corresponds to the low analog signal 174. However, if the LSB portion of the calibration codeword 170 is all ones (e.g., 111111 in the illustrated example), then the interpolating switch matrix 176 may activate all of the transistor stages 178A-C, which causes the calibration interpolator circuit 130 to output a resulting analog signal that corresponds to the high analog signal 172. However, if the LSB portion of the calibration codeword 170 has a value of kc, where $0 \leq kc \leq 2^{Lc-1}$, then the interpolating switch matrix 160 may activate kc of the transistor stages 178A-C to yield a resulting analog signal having a value of $Vc_{output}=Vc_{low}+(kc/2^{Lc})(Vc_{high}-V_{low})$, where $Vc_{high}$ is the value of the high analog signal 172, and the $Vc_{low}$ is the value of the low analog signal 174. The resulting analog signal output from the calibration interpolator circuit 130 corresponds to the calibration signal generated by the calibration DAC circuit 110, which is applied to the output stage 135. Example implementations of the interpolating switch matrix 176, the bank of example transistor stages 178A-C and the output stage 135 are further described in, for example, U.S. Pat. No. 6,707,404 mentioned above.

The example interpolating string DAC 100 of FIG. 1 includes an example codeword storage 180 to store the respective calibration codewords 170 to be applied to the example calibration DAC circuit 110 for the different possible value of the digital input codewords 145 that can be applied to the example main DAC circuit 105. The example codeword storage 180 can be implemented by any number(s) and/or type(s) of memory or memories, storage mechanisms, etc. To select a particular calibration codeword 170 for a particular digital input codeword 145 input to the interpolating string DAC 100, the interpolating string DAC 100 of the illustrated example also include an example codeword mapper 185. In some examples, the codeword mapper 185 includes a decoder to determine a location in the codeword storage 180 that stores the particular calibration codeword 170 for the particular digital input codeword 145, and then retrieves that particular calibration codeword 170 for application to the calibration DAC circuit 110. Example implementations of the codeword mapper 185 are further described in, for example, U.S. Pat. No. 6,707,404 mentioned above.

Figure 2:
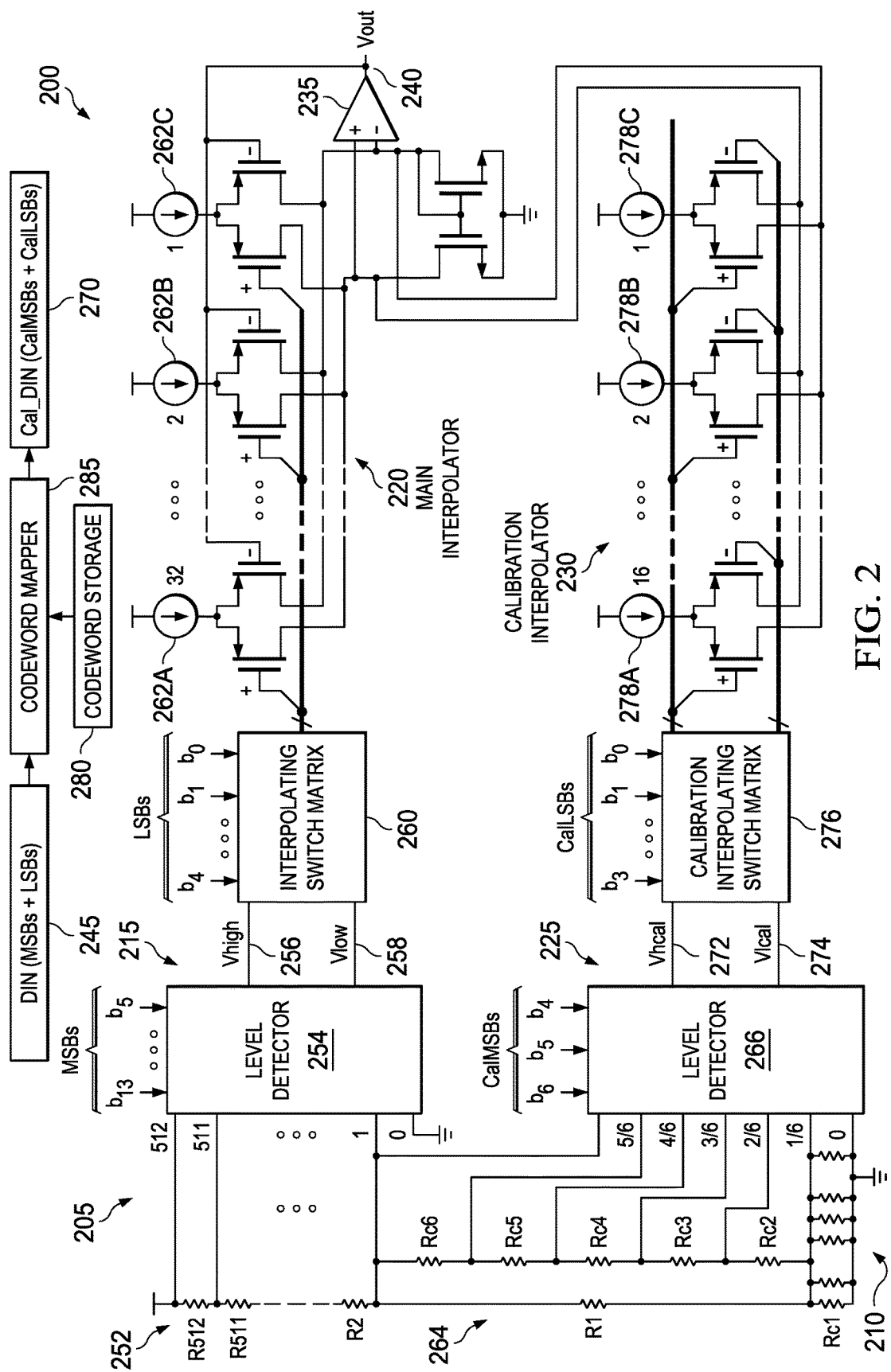
FIG. 2 is a block diagram of a second example interpolating string DAC capable of being calibrated in accordance with the teachings of this disclosure.

In the illustrated example of FIG. 1, the example interpolating string DAC 100 is structured to perform digital-to-analog conversion on 16-bit digital input codewords 145. The example interpolating string DAC 100 of FIG. 1 is further structured to calibrate its output analog signal based on 9-bit calibration codewords 170. A block diagram of another example interpolating string DAC 200 capable of being calibrated in accordance with the teachings of this disclosure is illustrated in FIG. 2. The overall structure and operation of the example interpolating string DAC 200 is similar to that of the example interpolating string DAC 100 of FIG. 1. However, the example interpolating string DAC 200 is structured to perform digital-to-analog conversion on 14-bit digital input codewords 245 (as compared to the 16-bit digital input codewords 145 processed by the example DAC 100), and to calibrate its output analog signal based on 7-bit calibration codewords 270 (as compared to the 9-bit calibration codewords 170 used by the example DAC 200).

In view of the similarities in the structure and operation of their respective circuit elements, similar elements in FIGS. 1 and 2 are labeled with reference numbers having the same lowest two (2) digits, but with the reference numerals in FIG. 2 beginning with the number "2," whereas the reference numerals in FIG. 1 begin with the number "1." The differences between the respective circuit elements depicted FIGS. 1 and 2 are now described. In the example interpolating string DAC 100 of FIG. 1, the example main DAC circuit 105 is structured to process 16-bit digital input codewords 145, with its example main coarse string DAC circuit 115 structured to process MSB portions of the digital input codewords 145 having a size of M=9 bits, and its example main interpolator circuit 120 structured to process LSB portions of the digital input codewords 145 having a size of L=7 bits. Furthermore, in the example interpolating string DAC 100 of FIG. 1, the example calibration DAC circuit 110 is structured to process 9-bit calibration codewords 170, with its example calibration coarse string DAC circuit 125 structured to process MSB portions of the calibration codewords 170 having a size of Mc=3 bits, and its example calibration interpolator circuit 130 structured to process LSB portions of the calibration codewords 170 having a size of Lc=6 bits.

In contrast, in the example interpolating string DAC 200 of FIG. 2, the example main DAC circuit 205 is structured to process 14-bit digital input codewords 245, with its example main coarse string DAC circuit 215 structured to process MSB portions of the digital input codewords 245 having a size of M=9 bits, and its example main interpolator circuit 220 structured to process LSB portions of the digital input codewords 245 having a size of L=5 bits. Furthermore, in the example interpolating string DAC 200 of FIG. 2, the example calibration DAC circuit 210 is structured to process 7-bit calibration codewords 270, with its example calibration coarse string DAC circuit 225 structured to process MSB portions of the calibration codewords 270 having a size of Mc=3 bits, and its example calibration interpolator circuit 230 structured to process LSB portions of the calibration codewords 270 having a size of Lc=4 bits. Furthermore, the example calibration coarse string DAC circuit 225 of the example interpolating string DAC 200 is structured to support a subrange (e.g., 6 values) of the full range (e.g., $2^{Mc}=2^3=8$ values) of the MSB portion of the calibration codeword 270. Accordingly, the example calibration coarse string DAC circuit 225 of FIG. 2 is said to have a step size of ⅙, whereas the example calibration coarse string DAC circuit 125 of FIG. 1 is said to have a step size of ⅛. Otherwise, operation of the example interpolating string DAC 200 of FIG. 2 is similar to operation of the example interpolating string DAC 100 of FIG. 1.

Figure 3A:
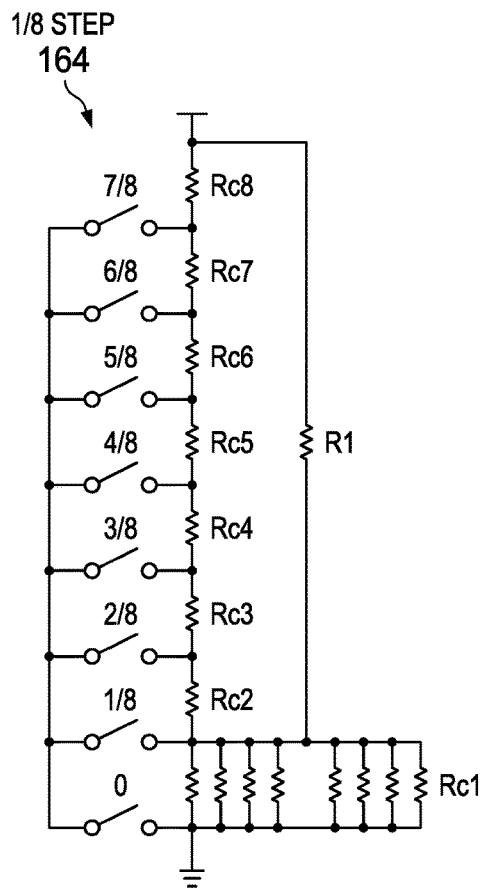
FIGS. 3A-D illustrate respective example calibration resistor circuits that can be used to implement the example interpolating string DACs of FIGS. 1 and/or 2.
Figure 3B:
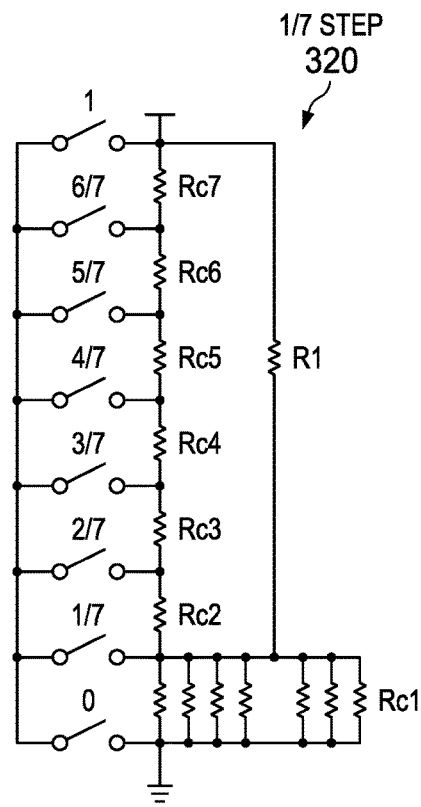
Figure 3C:
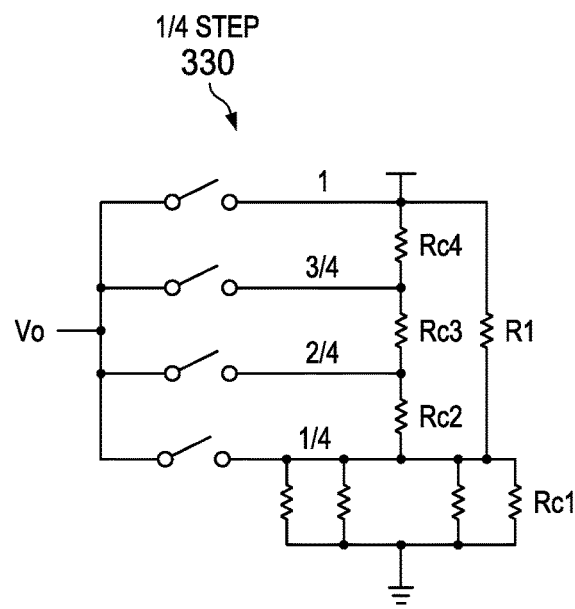
Figure 3D:
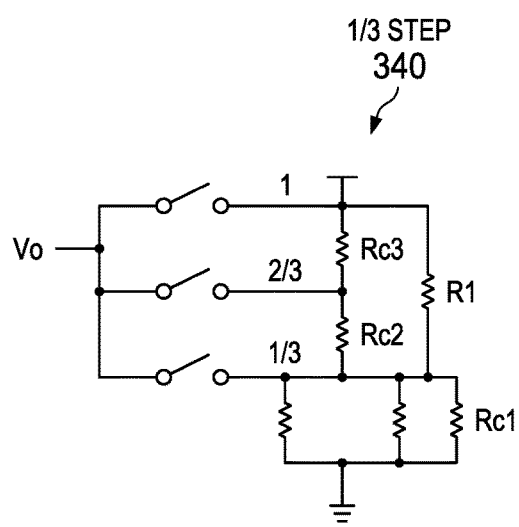

Example calibration resistor circuits that can be used to implement interpolating string DACs, such as the example interpolating string DACs 100 and 200 of FIGS. 1 and 2, respectively, are illustrated in FIGS. 3A-D. FIG. 3A illustrates the example calibration resistor circuit 164 of FIG. 1, which has a ⅛ step size and supports the full range of values (e.g., $2^{Mc}=2^3=8$ values) of the MSB portion of the calibration codeword 170. FIG. 3B illustrates an example calibration resistor circuit 320, which has a ⅐ step size and supports a subrange of 7 values of a full range of values (e.g., $2^{Mc}=2^3=8$ values) corresponding to a 3-bit MSB portion of a calibration codeword (e.g., Mc=3). FIG. 3C illustrates an example resistor circuit 330, which has a ¼ step size and supports a full range of values (e.g., $2^{Mc}=2^2=4$ values) corresponding to a 2-bit MSB portion of a calibration codeword (e.g., Mc=2). FIG. 3D illustrates an example resistor circuit 340, which has a ⅓ step size and supports a subrange of 3 values of a full range of values (e.g., $2^{Mc}=2^2=4$ values) corresponding to a 2-bit MSB portion of a calibration codeword (e.g., Mc=2).

Each of the example resistor circuits 164, 320, 330 and 340 includes a string of resistors (e.g., Rc2 to Rc8 for circuit 164, Rc2 to Rc7 for circuit 320, Rc2 to Rc4 for circuit 330, and Rc2 to Rc3 for circuit 340) electrically coupled in a series arrangement. In each of the example resistor circuits 164, 320, 330 and 340, this string of resistors is to be electrically coupled in parallel to a unit resistor (e.g., R1) of another string of resistors used to implement a main coarse string DAC circuit (e.g., such as the example main coarse string DAC circuit 115) of an interpolating string DAC (e.g., such as the example interpolating string DAC 100). Furthermore, with reference to the example interpolating string DAC 100 of FIG. 1, respective ones of the resistors in this string of resistors (e.g., Rc2 to Rc8 for circuit 164, Rc2 to Rc7 for circuit 320, Rc2 to Rc4 for circuit 330, and Rc2 to Rc3 for circuit 340) are to be coupled to respective inputs (e.g., corresponding to the inputs other than the lowest voltage level input) of a level detector (e.g., such as the example level detector 154) included in the main coarse string DAC circuit (e.g., such as the example main coarse string DAC circuit 115) of the interpolating string DAC (e.g., such as the example interpolating string DAC 100).

Each of the example resistor circuits 164, 320, 330 and 340 also includes a grouping of resistors (e.g., corresponding to the grouping of resistors forming the equivalent resistor Rc1 in each example circuit) electrically coupled in a parallel arrangement. In the illustrated example resistor circuits 164, 320, 330 and 340, a first circuit node of this grouping of resistors (e.g., the high voltage side of the parallel grouping of resistors forming the equivalent resistor Rc1) is electrically coupled to the string of resistors (e.g., Rc2 to Rc8 for circuit 164, Rc2 to Rc7 for circuit 320, Rc2 to Rc4 for circuit 330, and Rc2 to Rc3 for circuit 340) included in these circuits, whereas a second circuit node of this grouping of resistors (e.g., the low voltage side of the parallel grouping of resistors forming the equivalent resistor Rc1) is electrically coupled to ground. Additionally, the first circuit node of this grouping of resistors (e.g., the high voltage side of the parallel grouping of resistors forming the equivalent resistor Rc1) is also to be electrically coupled to the unit resistor (e.g., R1) of the other string of resistors used to implement the main coarse string DAC circuit (e.g., such as the example main coarse string DAC circuit 115) of the interpolating string DAC (e.g., such as the example interpolating string DAC 100). Furthermore, with reference to the example interpolating string DAC 100 of FIG. 1, the first circuit node of this grouping of resistors (e.g., the high voltage side of the parallel grouping of resistors forming the equivalent resistor Rc1) is to be coupled to a first input (e.g., a lowest voltage level input) of the level detector (e.g., such as the example level detector 154) included in the main coarse string DAC circuit (e.g., such as the example main coarse string DAC circuit 115) of the interpolating string DAC (e.g., such as the example interpolating string DAC 100).

In the example resistor circuits 164, 320, 330 and 340 of FIGS. 3A-D, the number of resistors included in the grouping of resistors forming the equivalent resistor Rc1 is one more than a number of resistors included in the string of resistors (e.g., Rc2 to Rc8 for circuit 164, Rc2 to Rc7 for circuit 320, Rc2 to Rc4 for circuit 330, and Rc2 to Rc3 for circuit 340) of the respective example resistor circuits. As described above, such an arrangement permits the example resistor circuits 164, 320, 330 and 340 to be implemented using resistors having resistance values that are substantially the same (e.g., within an error tolerance), and which is substantially the same (e.g., within an error tolerance) as the resistance value of the resistors used to implement the main resistor string (e.g., such as the main resistor string 152) of the main coarse string DAC circuit (e.g., such as the example main coarse string DAC circuit 115) of the interpolating string DAC (e.g., such as the example interpolating string DAC 100). Furthermore, such an arrangement results in the grouping of resistors forming the equivalent resistor Rc1 having an equivalent resistance that is substantially equal to (e.g., within an error tolerance) a resistance of one of the resistors included in the string of resistors divided by one more than a number of resistors included in the string of resistors. For example, if all of the resistors included in the example resistor circuit 164 have the same resistance value R, then the grouping of resistors forming the equivalent resistor Rc1 has an equivalent resistance of R/8, where the number 8 is one more than the number of resistors (e.g., 7) included in the string of resistors RC2 to RC8.

Figure 4:
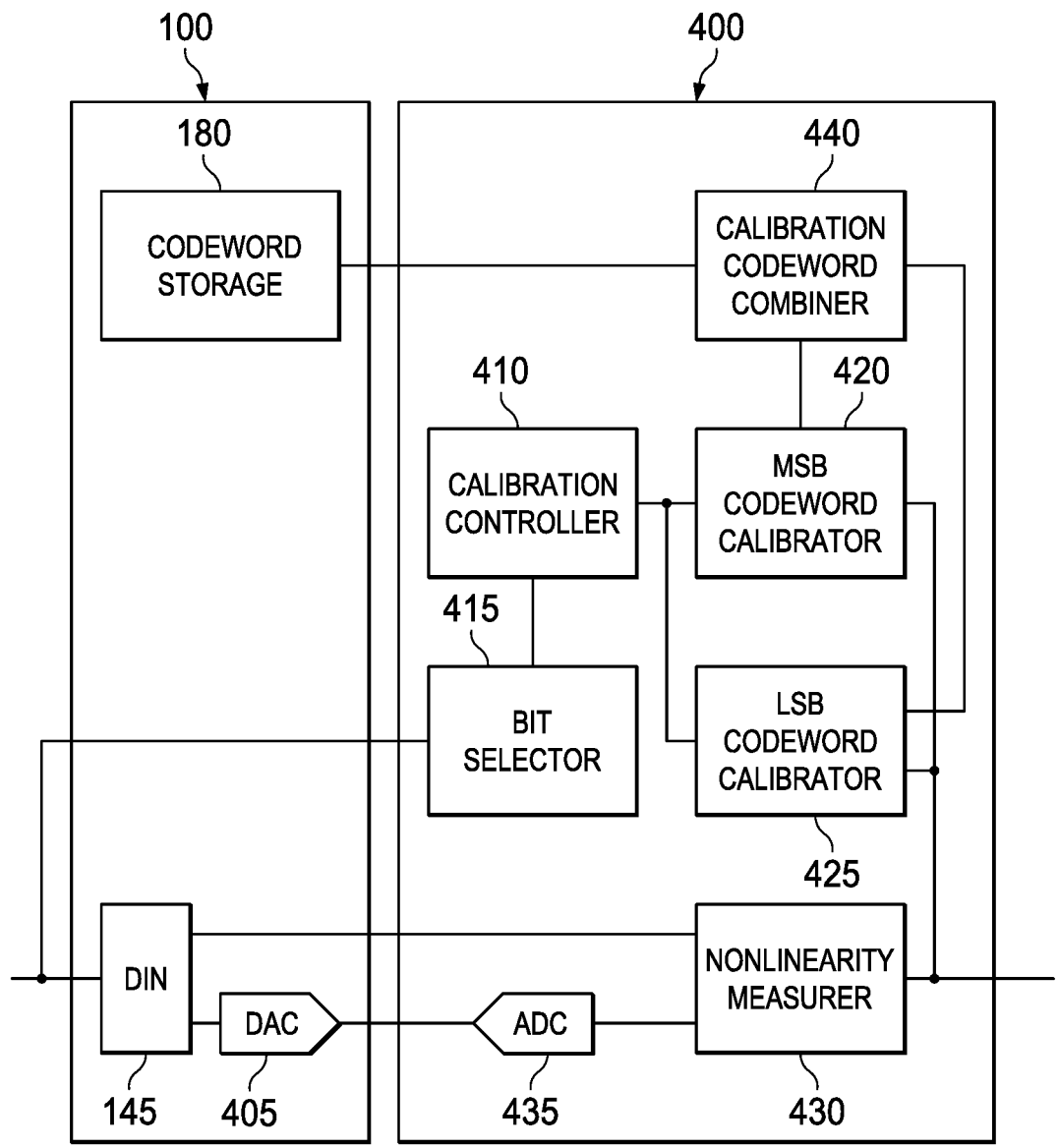
FIG. 4 is a block diagram of an example DAC calibrator that may be used to calibrate a DAC, such as the example interpolating string DACs of FIGS. 1 and/or 2, in accordance with the teachings of this disclosure.

A block diagram of an example DAC calibrator 400 capable of calibrating DACs, such as the example interpolating string DAC 100 of FIG. 1 and/or the example interpolating string DAC 200 of FIG. 2, is illustrated in FIG. 4. For convenience and without loss of generality, the example DAC calibrator 400 is illustrated in FIG. 4 in the context of being used to calibrate the example interpolating string DAC 100 of FIG. 1. Also, in the interest of clarity, the elements of the example interpolating string DAC 100 depicted in FIG. 4 include the example digital input codeword 145, the example codeword storage 180, and an example block 405 representing the other elements of the example interpolating string DAC 100.

Turning to FIG. 4, the example DAC calibrator 400 illustrated therein determines respective calibration codewords to be associated with the different possible values of the digital input codeword 145, and stores these calibration codewords in the example codeword storage 180. Then, during normal operation, the example interpolating string DAC 100 retrieves the respective calibration codeword 170 corresponding to the particular digital input codeword 145 being processed. The example interpolating string DAC 100 then applies the retrieved calibration codeword to its example calibration DAC circuit 110 to calibrate the output analog signal to compensate for the particular nonlinearity error(s) associated with that given digital input codeword 145. As described above, to reduce the number of calibration iterations involved in determining the calibration codewords, the example DAC calibrator 400 divides the digital input codeword 145 of Nbits into an MSB portion including the M most significant bits and an LSB portion including the L least significant bits, such that M+L=N. The example DAC calibrator 400 performs a first calibration process (e.g., an MSB calibration process) that involves cycling through each of the $2^M$ possible combinations of the MSB portion of digital input codeword 145 to determine $2^M$ respective MSB calibration codewords. The example DAC calibrator 400 also performs a second calibration process (e.g., an LSB calibration process) that involves cycling through each of the $2^L$ possible combinations of the LSB portion of the digital input codeword to determine $2^L$ respective LSB calibration codewords. The example DAC calibrator 400 further combines the determined MSB calibration codewords and LSB calibration codewords for different possible combinations of the MSB portion and LSB portion of the digital input codeword 145 to determine the $2^N$ respective calibration codewords corresponding to the $2^N$ possible digital input codewords 145.

Accordingly, the example DAC calibrator 400 of FIG. 4 includes an example calibration controller 410 to control whether the DAC calibrator 400 is to perform the first (e.g., MSB) calibration process, perform the second (e.g., LSB) calibration process, or combine the determined MSB calibration codewords and LSB calibration codewords to determine the overall calibration codewords to be stored in the example codeword storage 180. To perform the first (e.g., MSB) calibration process, the calibration controller 410 of the illustrated example invokes an example bit selector 415 to iterate through the $2^M$ different possible combinations of an M-bit MSB portion of digital input codeword 145. The example calibration controller 410 also invokes an example MSB codeword calibrator 420 to process nonlinearity error values, which are measured at the output of the example DAC 100 when each of the $2^M$ different possible combinations of the M-bit MSB portion of digital input codeword 145 is applied to the input of the DAC 100, to determine $2^M$ MSB calibration codewords corresponding respectively to the different possible combinations of the M-bit MSB portion of digital input codeword 145. In some examples, the number of bits, M, included in the M-bit MSB portion of the different combinations of the digital input codeword 145 processed by the MSB codeword calibrator 420 during the first (e.g., MSB) calibration process corresponds to the number of MSB bits processed by the example main coarse string DAC circuit 115 of the example interpolating string DAC 100. This value (M) is also referred to herein as the number of bits of resolution of the example main coarse string DAC circuit 115.

To perform the second (e.g., LSB) calibration process, the calibration controller 410 of the illustrated example invokes the example bit selector 415 to iterate through the $2^L$ different possible combinations of an L-bit LSB portion of digital input codeword 145. The example calibration controller 410 also invokes an example LSB codeword calibrator 425 to process nonlinearity error values, which are measured at the output of the example DAC 100 when each of the $2^L$ different possible combinations of the L-bit LSB portion of digital input codeword 145 is applied to the input of the DAC 100, to determine $2^L$ LSB calibration codewords corresponding respectively to the different possible combinations of the L-bit LSB portion of digital input codeword 145. In some examples, the number of bits, L, included in the L-bit LSB portions of the different combinations of the digital input codeword 145 processed by the LSB codeword calibrator 425 during the second (e.g., LSB) calibration process corresponds to the number of LSB bits processed by the example main interpolator circuit 120 of the example interpolating string DAC 100. This value (L) is also referred to herein as the number of bits of resolution of the example main interpolator circuit 120.

The example DAC calibrator 400 includes an example nonlinearity measurer 430 to measure respective nonlinearity error values exhibited by the output of the example interpolating string DAC 100 for the $2^M$ different possible combinations of the M-bit MSB portion of digital input codeword 145 and the $2^L$ different possible combinations of an L-bit LSB portion of digital input codeword 145 applied by the example bit selector 415 to the input of the example DAC 100 during the first and second calibration processes, respectively. Examples of nonlinearity error values measured by the example nonlinearity measurer 430 include, but are not limited to, integral nonlinearity (INL) error values, differential nonlinearity (DNL) error values, etc. For a given value of the digital input codeword 145, the INL error corresponds to the deviation between the actual value of the analog signal output by the DAC 100 and the ideal value of the analog signal desired to be output by the DAC 100 for that value of the digital input codeword 145. In other word, if Vout(i) is the actual value of the output signal generated by the DAC 100 when the digital input codeword 145 has the value i, and Videal(i) is the ideal value of the output signal expected to generated by the DAC 100 when the digital input codeword 145 has the value i, then the example nonlinearity measurer 430 may measure the INL error for the codeword i using Equation 1, which is:

$$INL(i) = Vout(i) - Videal(i) \qquad \text{Equation 1}$$

For a given value of the digital input codeword 145, the DNL error corresponds to the deviation between the actual difference in the output values generated by the DAC 100 for the given value of the digital input codeword 145 and the next adjacent value, and the desired step size of the DAC 100. In other word, if Vout(i) is the actual value of the output signal generated by the DAC 100 when the digital input codeword 145 has the value i, and Vout(i+1) is the actual value of the output signal generated by the DAC 100 when the digital input codeword 145 has the next adjacent value i+1, then the example nonlinearity measurer 430 may measure the DNL error for the codeword i using Equation 2, which is:

$$DNL(i) = \frac{(Vout(i+1) - Vout(i)) - \text{Ideal Step Size}}{\text{Ideal Step Size}} = \qquad \text{Equation 2}$$
$$\frac{Vout(i+1) - Vout(i)}{\text{Ideal Step Size}} - 1$$

In Equation 2, the DNL error is normalized by the ideal step size (by dividing by "Ideal Step Size" in the equation). However, in some examples, the example nonlinearity measurer 430 measures DNL error without normalizing by the ideal step size of the DAC 100.

In some examples, the example DAC calibrator 400 includes an example analog-to-digital converter (ADC) 435 to allow the example nonlinearity measurer 430 to measure the INL error and/or DNL error without having access to the ideal analog output values (e.g., Videal(i)) expected to be generated by the DAC 100 for each possible value i of the digital input codeword 145 to be examined, and/or without having access to the value of the ideal step size of the DAC 100. For example, if the ADC 435 and the DAC 100 have the same number of bits and same step size, then the ideal output of the ADC 435 when the digital input codeword 145 has the value i will also be the value i, and the ideal step size exhibited by the output of the ADC 435 for adjacent values of the digital input codeword 145 (e.g., i and i+1) is one (1). Thus, INL error measured by the example nonlinearity measurer 430 in the presence of the example ADC 435 will be a digital value corresponding to the difference between the value of the digital input codeword 145 (e.g., i) and the digital output of the ADC 435. The example nonlinearity measurer 430 can then multiply this digital value by the step size of the ADC 435 to obtain the measured INL error, INL(i), exhibited by the DAC 100 when the digital input codeword 145 has the value i. The DNL error measured by the example nonlinearity measurer 430 in the presence of the example ADC 435 will be a digital value representing how much the step size differs from the ideal value of 1 at the given value i for the digital input codeword 145. The example nonlinearity measurer 430 can then multiply this digital value by the step size of the ADC 435 to obtain the measured DNL error, DNL(i), exhibited by the DAC 100 when the digital input codeword 145 has the value i.

In some examples, the example MSB codeword calibrator 420 processes INL error values measured by the example nonlinearity measurer 430 at the output of the example DAC 100 when each of the $2^M$ different possible combinations of the M-bit MSB portion of digital input codeword 145 is applied to the input of the DAC 100, to determine the $2^M$ MSB calibration codewords corresponding respectively to the different possible combinations of the M-bit MSB portion of digital input codeword 145. In some examples, the example LSB codeword calibrator 425 processes INL error values measured by the example nonlinearity measurer 430 at the output of the example DAC 100 when each of the $2^L$ different possible combinations of the L-bit LSB portion of digital input codeword 145 is applied to the input of the DAC 100, to determine the $2^L$ LSB calibration codewords corresponding respectively to the different possible combinations of the L-bit LSB portion of digital input codeword 145. Examples of such processing are described in further detail below.

The example DAC calibrator 400 of FIG. 4 also includes an example calibration codeword combiner 440 to be invoked by the example calibration controller 410 to combine appropriate ones of the MSB calibration codewords determined by the MSB codeword calibrator 420 with appropriate ones of the LSB calibration codewords determined by the LSB codeword calibrator 425 to determine the $2^N$ respective calibration codewords corresponding to the $2^N$ possible digital input codewords 145. In some examples, to determine the complete calibration codeword for a given value i of the digital input codeword 145, the calibration codeword combiner 440 accesses the particular MSB calibration codeword determined by the MSB codeword calibrator 420 for the MSB portion of the value i of the digital input codeword 145. In some examples, to determine the overall calibration codeword for a given value i of the digital input codeword 145, the calibration codeword combiner 440 also accesses the particular LSB calibration codeword determined by the LSB codeword calibrator 425 for the LSB portion of the value i of the digital input codeword 145. In some examples, the calibration codeword combiner 440 then adds (or otherwise combines) the particular accessed MSB calibration codeword and the particular accessed LSB calibration codeword to determine the complete calibration codeword corresponding to the given value i of the digital input codeword 145. The calibration codeword combiner 440 of the illustrated example stores this complete calibration codeword in the example codeword storage 180 as the corresponding calibration codeword to be retrieved and applied to the example calibration DAC circuit 110 of the DAC 100 when the value of the digital input codeword 145 applied to the DAC 100 is i.

In some examples, the nonlinearity measurer 430 is further structured to report or otherwise output the nonlinearity error values measured during calibration of the example DAC 100. For example, the example nonlinearity measurer 430 may output the INL error values and/or DNL error values measured at the output of the example DAC 100 when each of the $2^M$ different possible combinations of the M-bit MSB portion of digital input codeword 145 is applied to the input of the DAC 100 during the first (e.g., MSB) calibration process. The example nonlinearity measurer 430 may also output the INL error values and/or DNL error values measured at the output of the example DAC 100 when each of the $2^L$ different possible combinations of the L-bit LSB portion of digital input codeword 145 is applied to the input of the DAC 100 during the second (e.g., LSB) calibration process. In some examples, the nonlinearity measurer 430 additionally or alternatively calculates an uncalibrated INL error and/or an uncalibrated DNL error for a given value i of the digital input codeword 145 by combining the INL error values and/or DNL error values measured for the MSB portion and LSB portion of digital input codeword 145 corresponding to the value i. Additionally or alternatively, in some examples, the nonlinearity measurer 430 calculates a calibrated INL error and/or a calibrated DNL error for a given value i of the digital input codeword 145 by combining the INL error values and/or DNL error values measured for the MSB portion and LSB portion of digital input codeword 145 corresponding to the value i, with the particular MSB calibration codeword and LSB codeword determined for the MSB portion and LSB portion, respectively, of digital input codeword 145 corresponding to the value i. Examples of such processing are described in further detail below.

While an example manner of implementing the DAC calibrator 400 is illustrated in FIG. 4, one or more of the elements, processes and/or devices illustrated in FIG. 4 may be combined, divided, re-arranged, omitted, eliminated and/or implemented in any other way. Further, the example calibration controller 410, the example bit selector 415, the example MSB codeword calibrator 420, the example LSB codeword calibrator 425, the example nonlinearity measurer 430, the example ADC 435, the example calibration codeword combiner 440 and/or, more generally, the example DAC calibrator 400 of FIG. 4 may be implemented by hardware, software, firmware and/or any combination of hardware, software and/or firmware. Thus, for example, any of the example calibration controller 410, the example bit selector 415, the example MSB codeword calibrator 420, the example LSB codeword calibrator 425, the example nonlinearity measurer 430, the example ADC 435, the example calibration codeword combiner 440 and/or, more generally, the example DAC calibrator 400 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example DAC calibrator 400, the example calibration controller 410, the example bit selector 415, the example MSB codeword calibrator 420, the example LSB codeword calibrator 425, the example nonlinearity measurer 430, the example ADC 435 and/or the example calibration codeword combiner 440 is/are hereby expressly defined to include a tangible computer readable storage device or storage disk such as a memory, a digital versatile disk (DVD), a compact disk (CD), a Blu-ray disk, etc. storing the software and/or firmware. Further still, the example DAC calibrator 400 of FIG. 4 may include one or more elements, processes and/or devices in addition to, or instead of, those illustrated in FIG. 4, and/or may include more than one of any or all of the illustrated elements, processes and devices.

Flowcharts representative of example machine readable instructions for implementing the example DAC calibrator 400, the example calibration controller 410, the example bit selector 415, the example MSB codeword calibrator 420, the example LSB codeword calibrator 425, the example nonlinearity measurer 430, the example ADC 435 and/or the example calibration codeword combiner 440 are shown in FIGS. 5-9. In these examples, the machine readable instructions comprise one or more programs for execution by a processor, such as the processor 1012 shown in the example processor platform 1000 discussed below in connection with FIG. 10. The one or more programs, or portion(s) thereof, may be embodied in software stored on a tangible computer readable storage medium such as a CD-ROM, a floppy disk, a hard drive, a digital versatile disk (DVD), a Blu-ray Disk™, or a memory associated with the processor 1012, but the entire program or programs and/or portions thereof could alternatively be executed by a device other than the processor 1012 and/or embodied in firmware or dedicated hardware (e.g., implemented by an ASIC, a PLD, an FPLD, discrete logic, etc.). Further, although the example program(s) is(are) described with reference to the flowcharts illustrated in FIGS. 5-9, many other methods of implementing the example DAC calibrator 400, the example calibration controller 410, the example bit selector 415, the example MSB codeword calibrator 420, the example LSB codeword calibrator 425, the example nonlinearity measurer 430, the example ADC 435 and/or the example calibration codeword combiner 440 may alternatively be used. For example, with reference to the flowcharts illustrated in FIGS. 5-9, the order of execution of the blocks may be changed, and/or some of the blocks described may be changed, eliminated, combined and/or subdivided into multiple blocks.

As mentioned above, the example processes of FIGS. 5-9 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 5-9 may be implemented using coded instructions (e.g., computer and/or machine readable instructions) stored on a non-transitory computer and/or machine readable medium such as a hard disk drive, a flash memory, a ROM, a CD, a DVD, a cache, a RAM and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the terms "comprising" and "including" are open ended. Also, as used herein, the terms "computer readable" and "machine readable" are considered equivalent unless indicated otherwise.

Figure 5:
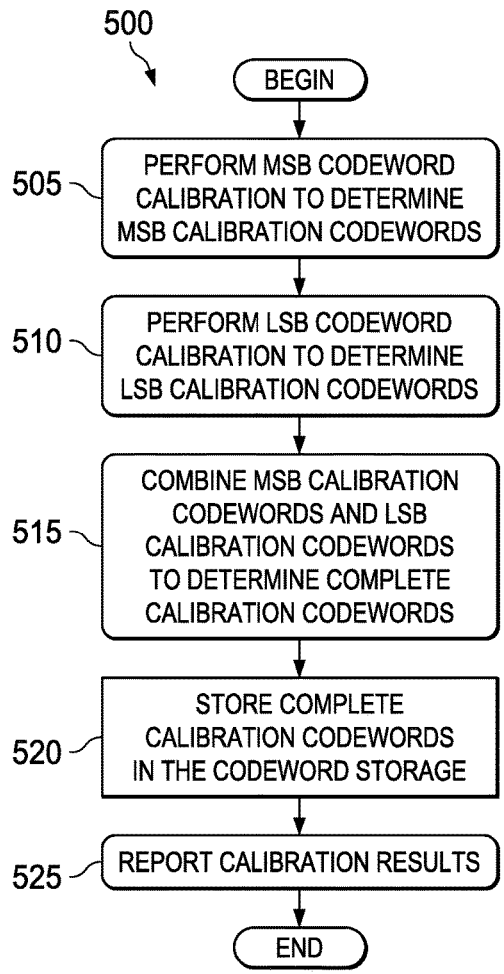
Figure 6:
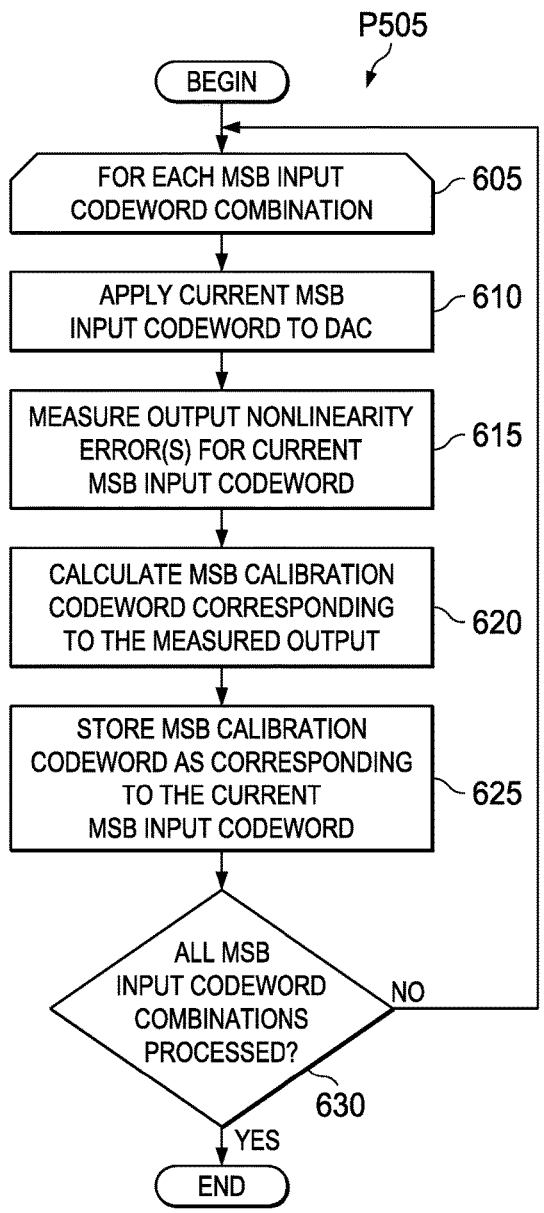

An example program 500 that may be executed to implement the example DAC calibrator of FIG. 4 is represented by the flowchart shown in FIG. 5. With reference to the preceding figures and associated written descriptions, the example program 500 of FIG. 5 begins execution at block 505 at which the example calibration controller 410 invokes the example bit selector 415 and the example MSB codeword calibrator 420 to perform a first calibration process to determine the $2^M$ MSB calibration codewords corresponding respectively to the different possible combinations of the M-bit MSB portion of digital input codeword 145, as described above. Example machine readable instructions that may be executed to implement the processing at block 505 are illustrated in FIG. 6, which is described in further detail below. At block 510, the example calibration controller 410 invokes the example bit selector 415 and the example LSB codeword calibrator 425 to perform a second calibration process to determine the $2^L$ LSB calibration codewords corresponding respectively to the different possible combinations of the L-bit LSB portion of digital input codeword 145, as described above. Example machine readable instructions that may be executed to implement the processing at block 510 are illustrated in FIG. 7, which is described in further detail below.

Figure 9:
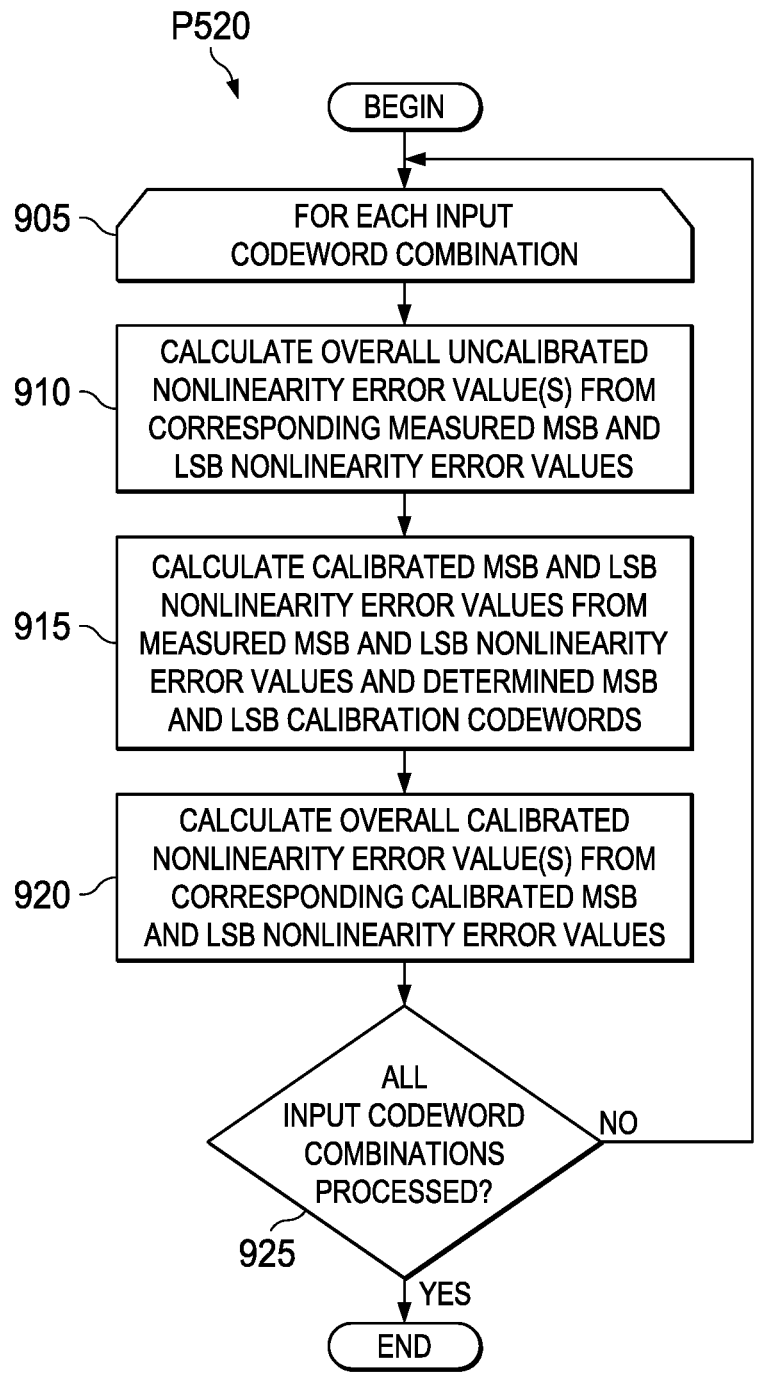

At block 515, the example calibration controller 410 invokes the example calibration codeword combiner 440 to combine appropriate ones of the MSB calibration codewords determined by the first calibration process performed at block 505 with appropriate ones of the LSB calibration codewords determined by the second calibration process performed at block 510 to determine the $2^N$ complete calibration codewords corresponding, respectively, to the $2^N$ possible digital input codewords 145, as described above. Example machine readable instructions that may be executed to implement the processing at block 515 are illustrated in FIG. 8, which is described in further detail below. At block 520, the example calibration codeword combiner 440 stores the $2^N$ complete calibration codewords determined at block 515 for the corresponding $2^N$ possible digital input codewords 145 in the example codeword storage 180, as described above. In some examples, at block 525, the example nonlinearity measurer 430 reports calibration results, which may include (i) nonlinearity error values for the MSB and/or LSB portions of the digital input codeword 145 measured during calibration, (ii) uncalibrated nonlinearity error values calculated for complete values of the digital input codeword 145 from the measured nonlinearity error values, (iii) calibrated nonlinearity error values calculated for complete values of the digital input codeword 145 from the measured nonlinearity error values and the determined calibration codewords, etc. Example machine readable instructions that may be executed to implement the processing at block 525 are illustrated in FIG. 9, which is described in further detail below. Execution of the example program then ends.

An example program P505 that may be executed to implement the processing at block 505 of FIG. 5 is represented by the flowchart shown in FIG. 6. With reference to the preceding figures and associated written descriptions, the example program P505 of FIG. 6 begins execution at block 605 at which the example calibration controller 410 invokes the example bit selector 415 to begin iterating through each of the $2^M$ different possible combinations of the M-bit MSB portion of digital input codeword 145. At block 610, the example bit selector 415 applies the current iteration's value of the M-bit MSB portion of digital input codeword 145 to the input of the example DAC 100 to be calibrated. This value of the M-bit MSB portion of the digital input codeword 145 is denoted as codemsb in the following disclosure. At block 615, the example nonlinearity measurer 430 measures nonlinearity error value(s) exhibited by the exhibited by the output of the example DAC 100 when the MSB portion of the digital input codeword 145 is set to the present value of codemsb (and the LSB portion is set to 0) For example, at block 615, the example nonlinearity measurer 430 may measure the INL and DNL error values, denoted as $INL\_MSB_{codemsb}$ and $DNL\_MSB_{codemsb}$ in the following disclosure, exhibited by the output of the example DAC 100 when the MSB portion of the digital input codeword 145 is set to the present value of codemsb.

At block 620, the example calibration controller 410 invokes the example MSB codeword calibrator 420 to process the nonlinearity error value(s) measured at block 615 to determine the particular MSB calibration codeword 615 corresponding to the current iteration's value of codemsb for the M-bit MSB portion of digital input codeword 145. In some examples, the MSB codeword calibrator 420 uses the INL error, $INL\_MSB_{codemsb}$, measured for the current iteration's value of codemsb for the M-bit MSB portion of digital input codeword 145, to determine the particular MSB calibration codeword at block 620 according to Equation 3, which is:

$$\text{calibration\_code\_msb\_INL}_{codemsb} = \text{floor}\left(\frac{INL\_MSB_{codemsb}}{\text{calibration\_step}} \cdot 2^{\text{lsb\_cal}}\right) \quad \text{Equation 3}$$

In Equation 3, calibration_code_msb_$INL_{codemsb}$ represents the particular MSB calibration codeword corresponding to the current iteration's value of codemsb for the M-bit MSB portion of digital input codeword 145, calibration_step represents the step size of the example calibration DAC circuit 110 included in the example DAC 100, the value $2^{lsb\_cal}$ represents the full range of the example calibration interpolator circuit 130 of the example calibration DAC circuit 110 (and corresponds to $2^{Lc}$ using the notation from the description of FIG. 1), and floor(x) is an operation that rounds the operand x down to the nearest integer value. Thus, Equation 3 determines calibration_code_msb_$INL_{codemsb}$ by multiplying $INL\_MSB_{codemsb}$ by a ratio of the full range of the example calibration interpolator circuit 130 divided by the step size of the example calibration DAC circuit 110 to determine an intermediate value, and then sets calibration_code_msb_$INL_{codemsb}$ to be the next lowest integer less than or equal to this intermediate value.

At block 625, the example MSB codeword calibrator 420 stores the particular MSB calibration codeword (e.g., calibration_code_msb_$INL_{codemsb}$) determined at block 620 in local storage of the example DAC calibrator 400, and associates this particular stored MSB calibration codeword with the current iteration's value of codemsb for the M-bit MSB portion of digital input codeword 145. In some examples, the local storage of the example DAC calibrator 400 is implemented by the example volatile memory 1014 and/or the example mass storage device(s) 1028 of the example processor platform 1000 of FIG. 10, which is described in further detail below. At block 630, the example bit selector 415 continues iterating through each of the $2^M$ different possible combinations of the M-bit MSB portion of digital input codeword 145 until all the possible combinations have been processed. Execution of the example program P505 then ends.

An example program P510 that may be executed to implement the processing at block 510 of FIG. 5 is represented by the flowchart shown in FIG. 7. With reference to the preceding figures and associated written descriptions, the example program P510 of FIG. 7 begins execution at block 705 at which the example calibration controller 410 invokes the example bit selector 415 to begin iterating through each of the $2^L$ different possible combinations of the L-bit LSB portion of digital input codeword 145. At block 710, the example bit selector 415 applies the current iteration's value of the L-bit LSB portion of digital input codeword 145 to the input of the example DAC 100 to be calibrated. This value of the LSB portion of the digital input codeword 145 is denoted as codelsb in the following disclosure. At block 715, the example nonlinearity measurer 430 measures nonlinearity error value(s) exhibited by the exhibited by the output of the example DAC 100 when the LSB portion of the digital input codeword 145 is set to the present value of codelsb (and the MSB portion is set to 0). For example, at block 715 the example nonlinearity measurer 430 may measure the INL and DNL error values, denoted as INL_LSB$_{codelsb}$ and DNL_LSB$_{codelsb}$ in the following disclosure, exhibited by the output of the example DAC 100 when the LSB portion of the digital input codeword 145 is set to the present value of codelsb (and the MSB portion is set to 0).

At block 720, the example calibration controller 410 invokes the example LSB codeword calibrator 425 to process the nonlinearity error value(s) measured at block 715 to determine the particular LSB calibration codeword corresponding to the current iteration's value of codelsb for the L-bit LSB portion of digital input codeword 145. In some examples, the LSB codeword calibrator 425 uses the INL error, INL_LSB$_{codelsb}$, measured for the current iteration's value of codelsb for the L-bit LSB portion of digital input codeword 145, to determine the particular LSB calibration codeword at block 720 according to Equation 4, which is:

$$\text{calibration\_code\_lsb\_INL}_{codelsb} = \text{floor}\left(\frac{\text{INL\_LSB}_{codelsb}}{\text{calibration\_step}}\right) \quad \text{Equation 4}$$

In Equation 4, calibration_code_lsb_INL$_{codelsb}$ represents the particular LSB calibration codeword corresponding to the current iteration's value of codelsb for the L-bit LSB portion of digital input codeword 145, calibration_step represents the step size of the example calibration DAC circuit 110 included in the example DAC 100, and floor(x) is an operation that rounds the operand x down to the nearest integer value. Thus, Equation 4 determines calibration_code_lsb_INL$_{codelsb}$ by dividing INL_MSB$_{codemsb}$ by the full range of the example calibration interpolator circuit 130 to determine an intermediate value, and then sets calibration_code_lsb_INL$_{codelsb}$ to be the next lowest integer less than or equal to this intermediate value.

At block 725, the example LSB codeword calibrator 425 stores the particular LSB calibration codeword (e.g., calibration_code_lsb_INL$_{codelsb}$) determined at block 720 in local storage of the example DAC calibrator 400, and associates this particular stored LSB calibration codeword with the current iteration's value of codelsb for the L-bit LSB portion of digital input codeword 145. In some examples, the local storage of the example DAC calibrator 400 is implemented by the example volatile memory 1014 and/or the example mass storage device(s) 1028 of the example processor platform 1000 of FIG. 10, which is described in further detail below. At block 730, the example bit selector 415 continues iterating through each of the $2^L$ different possible combinations of the L-bit LSB portion of digital input codeword 145 until all the possible combinations have been processed. Execution of the example program P510 then ends.

An example program P515 that may be executed to implement the processing at block 515 of FIG. 5 is represented by the flowchart shown in FIG. 8. With reference to the preceding figures and associated written descriptions, the example program P515 of FIG. 8 begins execution at block 805 at which the example calibration controller 410 invokes the example calibration codeword combiner 440 to begin iterating through each of the $2^N$ different possible combinations of the N-bit digital input codeword 145.

At block 810, the calibration codeword combiner 440 accesses the particular MSB calibration codeword corresponding to the M-bit MSB portion of the current iteration's digital input codeword 145. For example, if the current iteration's digital input codeword 145 is represented by i, then the M-bit MSB portion of the current iteration's digital input codeword 145 has a value given by Equation 5, which is:

$$\text{msbcode}(i) = \text{floor}\left(\frac{i}{2^{lsb}}\right) \quad \text{Equation 5}$$

In Equation 5, msbcode(i) represents the M-bit MSB portion of the digital input codeword 145 having the value i, the value $2^{lsb}$ represents the full range of the example main interpolator circuit 120 of the example main DAC circuit 105 of the example DAC 100 (and corresponds to $2^L$ using the notation from the description of FIG. 1), and floor(x) is an operation that rounds the operand x down to the nearest integer value. Thus, Equation 5 determines msbcode(i) by dividing i by the full range of the example main interpolator circuit 120, and then truncating the result to the nearest integer. In some examples, given the value of msbcode(i) as the M-bit MSB portion of the current iteration's digital input codeword 145, at block 810 the calibration codeword combiner 440 accesses the particular MSB calibration codeword given by Equation 3 for msbcode(i), which corresponds to calibration_code_msb_INL$_{msbcode(i)}$.

At block 815, the calibration codeword combiner 440 accesses the particular LSB calibration codeword corresponding to the L-bit LSB portion of the current iteration's digital input codeword 145. For example, if the current iteration's digital input codeword 145 is represented by i, then the L-bit LSB portion of the current iteration's digital input codeword 145 has a value given by Equation 6, which is:

$$\text{lsbcode}(i) = i - \text{msbcode}(i) \cdot 2^{lsb} \quad \text{Equation 6}$$

In Equation 6, lsbcode(i) represents the L-bit LSB portion of the digital input codeword 145 having the value i, msbcode(i) is given by Equation 5 and described above, and the value $2^{lsb}$ represents the full range of the example main interpolator circuit 120 of the example main DAC circuit 105 of the example DAC 100 (and corresponds to $2^L$ using the notation from the description of FIG. 1). Thus, Equation 6 determines lsbcode(i) by multiplying the value of msbcode(i) by the full range of the example main interpolator circuit 120, and then subtracting the result from i. In some examples, given the value of lsbcode(i) as the L-bit LSB portion of the current iteration's digital input codeword 145, at block 815 the calibration codeword combiner 440 accesses the particular LSB calibration codeword given by Equation 4 for lsbcode(i), which corresponds to calibration_code_lsb_INL$_{lsbcode(i)}$.

At block 820, the calibration codeword combiner 440 combines the particular MSB codeword accessed at block 810 for MSB portion of the current iteration's digital input codeword 145 and the LSB codeword accessed at block 815 for LSB portion of the current iteration's digital input codeword 145 to determine the complete calibration codeword for the current iteration's digital input codeword 145. In some examples, the calibration codeword combiner 440 combines the MSB codeword and the LSB codeword by adding the MSB codeword and the LSB codeword according to Equation 7, which is:

calibration_code$_i$=calibration_code_msb_INL$_{msbcode(i)}$+calibration_code_lsb_INL$_{lsbcode(i)}$   Equation 7

In Equation 7, calibration_code$_i$ represents the particular calibration code corresponding to the digital input codeword 145 having the value i.

At block 825, the calibration codeword combiner 440 stores the complete calibration codeword determined at block 820 for the current iteration's digital input codeword 145 in the example codeword storage 180 of the example DAC 100, as described above. At block 830, the calibration codeword combiner 440 continues iterating through each of the $2^N$ different possible combinations of the N-bit digital input codeword 145 until all the possible combinations have been processed. Execution of the example program P515 then ends.

An example program P525 that may be executed to implement the processing at block 525 of FIG. 5 is represented by the flowchart shown in FIG. 9. With reference to the preceding figures and associated written descriptions, the example program P525 of FIG. 9 begins execution at block 905 at which the example nonlinearity measurer 430 begins iterating through each of the $2^N$ different possible combinations of the N-bit digital input codeword 145 to determine calibration results for each possible value of the N-bit digital input codeword 145. For example, the nonlinearity measurer 430 may iterate over the possible values of the N-bit digital input codeword 145 from i=0, 1, . . . $2^N-1$.

At block 910, for a given value, i, of the N-bit digital input codeword 145, the example nonlinearity measurer 430 calculates overall uncalibrated nonlinearity error value(s) from the corresponding MSB and LSB nonlinearity error values measured for that value of the N-bit digital input codeword 145 during the first and second calibration processes described above. For example, and as described above, let DNL_MSB$_{codemsb}$ represent the MSB DNL error value measured during the first calibration process from the output of the example DAC 100 when the digital input codeword 145 is set to have an MSB portion equal to codemsb and an LSB portion equal to 0, and let DNL_LSB$_{codelsb}$ represent the LSB DNL error value measured during the second calibration process from the output of the example DAC 100 when the digital input codeword 145 is set to have an LSB portion equal to codelsb and an MSB portion equal to 0. Then, at block 910, the nonlinearity measurer 430 can calculate the overall DNL error for the digital input codeword 145 having the value i, which is represented in the following disclosure as DNL_cal$_i$, using the example algorithm provided in Table 1.

TABLE 1

Example Algorithm for Calculating DNL_cal$_i$, for a Digital Input Codeword = i $$\text{DNL\_cal}_i = \begin{cases} \text{DNL\_LSB}_i & \text{if } i \leq 2^L = 2^{lsb} \\ \text{Ratio}_{LSB(i)} \cdot (\text{DNL\_MSB}_{MSB(i)+1} + 1) \cdot 2^L - 1 & \text{otherwise} \end{cases}$$

where:

$$\text{Ratio}_{LSB(i)} = \frac{\text{lsb\_ideal} \cdot (\text{DNL\_LSB}_{lsbindex+1} + 1)}{2^L \cdot \text{lsb\_ideal} \cdot (\text{DNL\_MSB}_1 + 1)}$$

$$\text{MSB}(x) = \text{floor}\left(\frac{x-1}{2^L}\right)$$

TABLE 1-continued

Example Algorithm for Calculating DNL_cal$_i$, for a Digital Input Codeword = i

LSB(x) = x − MSB(x) · $2^L$ − 1
lsb_ideal corresponds to the ideal value of the output DAC voltage when just the single LSB is applied as the digital input codeword 145,
lsb_index ranges over 0, 1, . . . $2^L - 1$, and
$2^L = 2^{lsb}$ corresponds to the range pf the LSB portions of the digital input codeword used during calibration, and also corresponds to the full range of the full range of the example main interpolator circuit 120 of the example main DAC circuit 105 of the example DAC 100.

As another example, let INL_MSB$_{codemsb}$ represent the MSB INL error value measured during the first calibration process from the output of the example DAC 100 when the digital input codeword 145 is set to have an MSB portion equal to codemsb and an LSB portion equal to 0, and let INL_LSB$_{codelsb}$ represent the LSB INL error value measured during the second calibration process from the output of the example DAC 100 when the digital input codeword 145 is set to have an LSB portion equal to codelsb and an MSB portion equal to 0, as described above. Then, at block 910, the nonlinearity measurer 430 can calculate the overall INL error for the digital input codeword 145 having the value i, which is represented in the following disclosure as INL_cal$_i$, using the example algorithm provided in Table 2.

TABLE 2

Example Algorithm for Calculating INL_cal$_i$, for a Digital Input Codeword = i $$\text{INL}_{cal_i} = \begin{cases} \text{INL\_LSB}_i & \text{if } i < 2^L = 2^{lsb} \\ \text{INL\_MSB}_{MSB(i+1)} \cdot 2^L & \text{if } i > 2^L - 1 \text{ and } \text{LSB}(i+1) = 0 \\ \text{cala}_i & \text{f } i > 2^L - 1 \text{ and } \text{LSB}(i+1) \neq 0 \end{cases}$$

where:

$$\text{cala}_{index} = \text{INL\_MSB}_{MSB(index+1)} \cdot 2^L +$$
$$\frac{a(\text{LSB}(index+1)) \cdot b(index) - \text{LSB}(index+1)\text{lsb\_ideal}}{\text{lsb\_ideal}}$$

$$a(i) = \frac{\text{INL\_LSB}_1 \cdot \text{lsb\_ideal} + \text{INL\_LSB}_0 \cdot \text{lsb\_ideal} - i \cdot \text{isb\_ideal}}{\text{INL\_MSB}_1 \cdot 2^L \text{lsb\_ideal} + \text{INL\_MSB}_0 \cdot 2^L \text{lsb\_ideal} - 2^L \text{lsb\_ideal}}$$

$$b(i) = [(\text{INL\_MSB}_{MSB(i+2^L)} - \text{INL\_MSB}_{MSB(i)}) \cdot 2^L \text{lsb}_{ideal} + 2^L \text{lsb}_{ideal}]$$

$$\text{MSB}(x) = \text{floor}\left(\frac{x-1}{2^L}\right)$$

LSB(x) = x − MSB(x) · $2^L$ − 1
lsb_ideal corresponds to the ideal value of the output DAC voltage when just the single LSB is applied as the digital input codeword 145,
index ranges over 2L, . . . , 2N − 1, and
$2^L = 2^{lsb}$ corresponds to the range of the LSB portions of the digital input codeword used during calibration, and also corresponds to the full range of the full range of the example main interpolator circuit 120 of the example main DAC circuit 105 of the example DAC 100.

At block 915, the nonlinearity measurer 430 calculates calibrated MSB and LSB nonlinearity error value(s) for the given value, i, of the N-bit digital input codeword 145, from the corresponding measured MSB and LSB nonlinearity error values determined for that value of the digital input codeword 145 during the first and second calibration processes described above, and from the corresponding MSB and LSB calibration codewords determined for that value of the digital input codeword 145 during the first and second calibration processes described above. The calibrated MSB and LSB nonlinearity error value(s) calculated at block 915 represent the improvement in the MSB and LSB nonlinearity error value(s) achieved through calibration. For example, let $DNL\_MSB_{codemsb}$ and $INL\_MSB_{codemsb}$ represent the respective MSB DNL and INL error values measured during the first calibration process for the output of the example DAC 100 when the digital input codeword 145 is set to have an MSB portion equal to codemsb and an LSB portion equal to 0. Furthermore, let $DNL\_LSB_{codelsb}$ and $INL\_LSB_{codelsb}$ represent the LSB DNL and INL error values measured during the second calibration process for the output of the example DAC 100 when the digital input codeword 145 is set to have an LSB portion equal to codelsb and an MSB portion equal to 0. In some such examples, the nonlinearity measurer 430 calculates the value of the calibration signal expected to be output by the example calibration DAC circuit 110 for the MSB calibration codeword (e.g., calibration_code_msb_$INL_{codemsb}$ described above) and uses this value of the calibration signal to adjust the measured $DNL\_MSB_{codemsb}$ and $INL\_MSB_{codemsb}$ values to determine respective calibrated MSB DNL and INL values for the current value of the digital input codeword 145. Similarly, in some such examples, the nonlinearity measurer 430 calculates the value of the calibration signal expected to be output by the example calibration DAC circuit 110 for LSB calibration codeword (e.g., calibration_code_lsb_$INL_{codelsb}$ described above) and uses this value of the calibration signal to adjust the measured $DNL\_LSB_{codelsb}$ and $INL\_LSB_{codelsb}$ values to determine respective calibrated LSB DNL and INL values for the current value of the digital input codeword 145.

At block 920, the example nonlinearity measurer 430 calculates overall calibrated nonlinearity error value(s) from the corresponding calibrated MSB and LSB nonlinearity error values calculated at block 915 for the current iteration's value of the N-bit digital input codeword 145. For example, the example nonlinearity measurer 430 can replace measured (uncalibrated) DNL and INL error values in the algorithms of Table 1 and/or Table 2 with the corresponding calibrated MSB and LSB nonlinearity error values calculated at block 915 to calculate the overall, calibrated DNL and INL errors corresponding to the current iteration's value of the N-bit digital input codeword 145.

At block 925, the nonlinearity measurer 430 continues iterating through each of the $2^N$ different possible combinations of the N-bit digital input codeword 145 until all the possible combinations have been processed. Execution of the example program P525 then ends.

Figure 10:
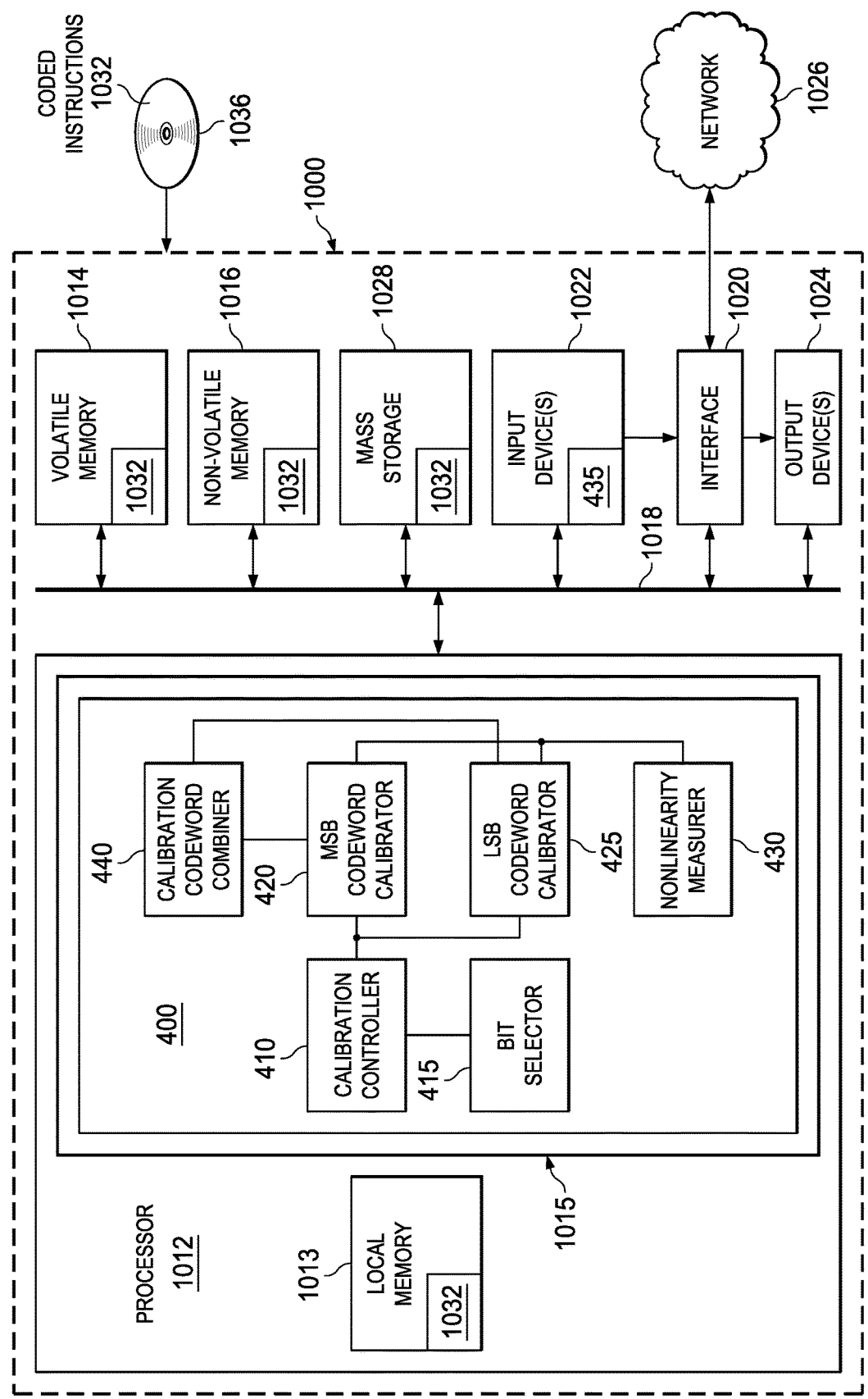
FIG. 10 is a block diagram of an example processor platform structured to execute the example machine readable instructions of FIGS. 5-8 and/or 9 to implement the example DAC calibrator of FIG. 4.

FIG. 10 is a block diagram of an example processor platform 1000 capable of executing the instructions of FIGS. 5-8 and/or 9 to implement the example DAC calibrator 400 of FIG. 4. The processor platform 1000 can be, for example, a server, a personal computer, a mobile device (e.g., a cell phone, a smart phone, a tablet such as an iPad™), an Internet appliance, a testing platform, an embedded controller, or any other type of computing device.

The processor platform 1000 of the illustrated example includes a processor 1012. The processor 1012 of the illustrated example is hardware. For example, the processor 1012 can be implemented by one or more integrated circuits, logic circuits, microprocessors, digital signal processor (DSPs) and/or controllers from any desired family or manufacturer. In the illustrated example of FIG. 10, the processor 1012 includes one or more example processing cores 1015 configured via example instructions 1032, which include the example instructions of FIGS. 5-8 and/or 9, to implement the example calibration controller 410, the example bit selector 415, the example MSB codeword calibrator 420, the example LSB codeword calibrator 425, the example nonlinearity measurer 430, the example calibration codeword combiner 440 and/or, more generally, the example DAC calibrator 400 of FIG. 4.

The processor 1012 of the illustrated example includes a local memory 1013 (e.g., a cache). The processor 1012 of the illustrated example is in communication with a main memory including a volatile memory 1014 and a non-volatile memory 1016 via a link 1018. The link 1018 may be implemented by a bus, one or more point-to-point connections, etc., or a combination thereof. The volatile memory 1014 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1016 may be implemented by flash memory and/or any other desired type of memory device. Access to the main memory 1014, 1016 is controlled by a memory controller.

The processor platform 1000 of the illustrated example also includes an interface circuit 1020. The interface circuit 1020 may be implemented by any type of interface standard, such as an Ethernet interface, a universal serial bus (USB), and/or a PCI express interface.

In the illustrated example, one or more input devices 1022 are connected to the interface circuit 1020. The input device(s) 1022 permit(s) a user to enter data and commands into the processor 1012. The input device(s) can be implemented by, for example, an audio sensor, a microphone, a camera (still or video), a keyboard, a button, a mouse, a touchscreen, a track-pad, a trackball, a trackbar (such as an isopoint), a voice recognition system and/or any other human-machine interface. Also, many systems, such as the processor platform 1000, can allow the user to control the computer system and provide data to the computer using physical gestures, such as, but not limited to, hand or body movements, facial expressions, and face recognition. In the illustrated example of FIG. 10, the input device(s) 1022 are also structured to implement the example ADC 435 of FIG. 4.

One or more output devices 1024 are also connected to the interface circuit 1020 of the illustrated example. The output devices 1024 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1020 of the illustrated example, thus, typically includes a graphics driver card, a graphics driver chip or a graphics driver processor.

The interface circuit 1020 of the illustrated example also includes a communication device such as a transmitter, a receiver, a transceiver, a modem and/or network interface card to facilitate exchange of data with external machines (e.g., computing devices of any kind) via a network 1026 (e.g., an Ethernet connection, a digital subscriber line (DSL), a telephone line, coaxial cable, a cellular telephone system, etc.).

The processor platform 1000 of the illustrated example also includes one or more mass storage devices 1028 for storing software and/or data. Examples of such mass storage devices 1028 include floppy disk drives, hard drive disks, compact disk drives, Blu-ray disk drives, RAID (redundant array of independent disks) systems, and digital versatile disk (DVD) drives.

Coded instructions 1032 corresponding to the instructions of FIGS. 5-8 and/or 9 may be stored in the mass storage device 1028, in the volatile memory 1014, in the non-volatile memory 1016, in the local memory 1013 and/or on a removable tangible computer readable storage medium, such as a CD or DVD 1036.

In some examples, the example DAC calibrator 400 of FIG. 4 is implemented by a single system-on-chip (SoC) device, such as an SoC device including a DSP, a microcontroller unit (MCU), etc., or any combination thereof. For example, the DAC calibrator 400 can be implemented by an SoC device that includes the example DAC calibrator 400 (e.g., including the example ADC 435), the example DAC 100 and/or 200, and a DSP and/or MCU. In some such examples, the SoC device may include memory to store coded instructions, such as the example instructions 1032 of FIG. 10, to be executed by the DSP and/or MCU (e.g., in addition to other coded instructions implemented other functionality) to perform DAC calibration in accordance with the teachings of this disclosure.

Finally, although certain example apparatus, methods, and articles of manufacture are described herein, other implementations are possible. The scope of coverage of this patent is not limited to the specific examples described herein. On the contrary, this patent covers all apparatus, methods, and articles of manufacture falling within the scope of the invention.

What is claimed is:

1. A digital-to-analog converter (DAC) calibrator comprising:
    a first codeword calibrator to determine a first calibration codeword based on a first nonlinearity error value measured at an output of a DAC when a most-significant-bit (MSB) portion of an input codeword is applied to an input of the DAC;
    a second codeword calibrator to determine a second calibration codeword based on a second measured nonlinearity error value measured at the output of the DAC when a least-significant-bit (LSB) portion of the input codeword is applied to the input of the DAC; and
    a calibration codeword combiner to combine the first calibration codeword and the second calibration codeword to determine a third calibration codeword to be accessed by the DAC to calibrate the output of the DAC when the input codeword is applied to the DAC.

2. A DAC calibrator as defined in claim 1, wherein the calibration codeword combiner is to determine the third calibration codeword by adding the first calibration codeword and the second calibration codeword to determine the third calibration codeword.

* * * * *